United States Patent [19]
Arimoto et al.

[11] Patent Number: 5,249,155
[45] Date of Patent: Sep. 28, 1993

[54] SEMICONDUCTOR DEVICE INCORPORATING INTERNAL VOLTAGE DOWN CONVERTING CIRCUIT

[75] Inventors: Kazutami Arimoto; Hideto Hidaka; Mikio Asakura; Masanori Hayashikoshi; Masaki Tsukude; Shinji Kawai; Tsukasa Ooishi, all of Hyogo, Japan

[73] Assignee: Mitsubishi Denki Kabushiki Kaisha, Tokyo, Japan

[21] Appl. No.: 819,208

[22] Filed: Jan. 10, 1992

[30] Foreign Application Priority Data

Jun. 20, 1991 [JP] Japan ................. 3-148967

[51] Int. Cl.$^5$ ............................. G11C 13/00
[52] U.S. Cl. .......................... 365/222; 365/226
[58] Field of Search ............... 365/222, 228, 226

[56] References Cited

FOREIGN PATENT DOCUMENTS

0063483A2 10/1982 European Pat. Off.
2232829A 12/1990 United Kingdom.

OTHER PUBLICATIONS

"On-Chip Supply Voltage Conversion System and Its Application to a 4Mb DRAM", Extended Abstracts of the 8th (1986 International) Conference on Solid State Devices and Materials, Tokyo, pp. 307–310, Watanabe et al.

"Dual-Operating-Voltage Scheme for a Single 5-V 16-Mbit DRAM", IEEE Journal of Solid State Circuits, vol. 23, No. 5, Oct. 1988, pp. 1128–1132, Masashi Horiguchi.

Primary Examiner—Terrell W. Fears
Attorney, Agent, or Firm—Lowe, Price, LeBlanc & Becker

[57] ABSTRACT

An n channel driver circuit comprised of an N-channel MOS transistor is provided in parallel to a driver circuit comprised of a P channel MOS transistor. Normally, n channel driver circuit supplies an internal supply voltage, to activate driver circuit only at the time of current peak. Thus, an insufficient capability of n$^-$ channel driver circuit to supply current is supplemented.

35 Claims, 43 Drawing Sheets (NORMAL CYCLE IN NORMAL MODE)

FIG.8 (CAS BEFORE RAS REFRESH CYCLE IN NORMAL MODE)

FIG.17 (BURN-IN MODE SET CYCLE)

(BURN-IN MODE RESET CYCLE)

(BURN-IN MODE RESET CYCLE)

(NORMAL CYCLE IN NORMAL MODE)

SEMICONDUCTOR DEVICE INCORPORATING INTERNAL VOLTAGE DOWN CONVERTING CIRCUIT

BACKGROUND OF THE INVENTION

Field of the Invention

The present invention relates generally to semiconductor devices and, more particularly, to a semiconductor device incorporating a voltage down converting circuit and to a method of monitoring a potential on an internal power supply line.

Description of the Background Art

For the purpose of alleviating an electric field to be applied to a gate oxide film of transistors, reducing current consumption, and the like in order to increase reliability, an internal voltage down converting circuit which down-converts an external supply voltage to a predetermined internal supply voltage to supply the down-converted voltage to an internal circuit has been developed in recent years.

(1) First Conventional Art (FIGS. 35-39)

FIG. 35 is a block diagram showing a conventional MOS.DRAM (Dynamic Random Access Memory) incorporating an internal voltage down converting circuit. The DRAM is disclosed in "On-Chip Supply Voltage Conversion System and Its Application to a 4 Mb DRAM", SSDM 86, Lecture No.-B-6-4.

A semiconductor device CH of FIG. 35 includes internal voltage down converting circuits 1a and 1b, a DRAM 3, a peripheral circuit 4 and an output buffer 5. This semiconductor device CH has a power supply terminal P1 for receiving an external supply voltage Vcc and a ground terminal P2 for receiving a ground potential Vss. Internal voltage down converting circuit 1a down-converts external supply voltage Vcc to an internal supply voltage IVcc 1 and supply the down-converted voltage to peripheral circuit 4. Peripheral circuit 4 includes an address buffer, a data input buffer, a control circuit and the like. Internal voltage down converting circuit 1b down-converts external supply voltage Vcc to an internal supply voltage IVcc 2 and supplies the down-converted voltage to DRAM 3. DRAM 3 includes a memory array MA and a CMOS sense amplifier SA. Output buffer 5 is driven by external supply voltage Vcc.

Memory array MA includes a plurality of word lines, a plurality of bit lines crossing over the word lines, a plurality of memory cells provided at crossing-points between the bit lines and the word lines, a row decoder for selecting any of the plurality of word lines, and a column decoder for selecting any of the plurality of bit lines. The CMOS sense amplifier includes a plurality of sense amplifiers for amplifying data read out onto the plurality of bit lines.

Internal voltage down converting circuit 1a is controlled by a control signal $\phi 1$, and internal voltage down converting circuit 1b is controlled by a control signal $\phi 2$.

FIG. 36 shows configuration of internal voltage down converting circuit 1a or 1b. The internal voltage down converting circuit includes a reference voltage generating circuit 10, a differential amplifying circuit 20 and a driver circuit 30. Reference voltage generating circuit 10 receives external supply voltage Vcc to generate a reference voltage VR1 that is hardly dependent on that external supply voltage Vcc. Reference voltage VR1 is applied as an input to differential amplifying circuit 20. An internal supply voltage IVcc being not dependent on fluctuations of supply voltage Vcc and on variations of a load current is generated by differential amplifying circuit 20 and driver circuit 30 and then applied to peripheral circuit 4 or DRAM 3. External supply voltage Vcc is, for example, 5V, and internal supply voltage IVcc is, for example, 4V.

FIG. 37 shows a detailed circuit configuration of the internal voltage down converting circuit. Reference voltage generating circuit 10 includes P channel MOS transistors Q11-Q15. External supply voltage Vcc is divided by transistors Q11-Q13, so that the divided voltage appears on a node N1. If external supply voltage Vcc rises, then the voltage on node N1 also rises, so that a transistor Q24 is turned off. This prevents an increase in voltage on a node N2. Conversely, if external supply voltage Vcc decreases, then the voltage on node N1 also decreases, so that transistor Q24 is turned on. This prevents a decrease in voltage on node N2. Thus, reference voltage VR1 that is hardly dependent on fluctuations of external supply voltage Vcc is generated from node N2.

Differential amplifier 20 includes a current mirror circuit comprised of P channel MOS transistors Q21 and Q22 and N channel MOS transistors Q23 and Q24. A P channel MOS transistor Q25 of a large size and a P channel MOS transistor Q26 of a small size are connected between a node N3 and a power supply terminal P1. These transistors Q25 and Q26 are provided to reduce power consumption of the current mirror circuit.

During an active period that DRAM 3 and peripheral circuit 4 are operative, a control signal $\phi i$ (i=1, 2) attains a logic low level, so that transistor Q25 is turned on. This improves a response of the current mirror circuit. During a standby period that only a small amount of current is consumed in DRAM 3 and peripheral circuit 4, control signal $\phi i$ attains a logic high level, so that transistor Q25 is turned off. In that case, only transistor Q26 of a small size having a micro current flowing therethrough is ON. Accordingly, although the sensitivity of the current mirror circuit decreases, power consumption is suppressed.

Driver circuit 30 includes a P channel MOS transistor Q35. Transistor Q22 of the current mirror circuit has its gate connected to a node N4. Transistor Q35 is connected between power supply terminal P1 and node N4. Transistor Q35 has its gate connected to a node N5 of the current mirror circuit.

If an internal supply voltage IVcc output from node N4 becomes higher than reference voltage VR1, then the value of a current flowing through transistor Q21 becomes higher than that of a current flowing through transistor Q22. This causes an increase in potential on node N5. Thus, transistor Q35 is rendered lightly conductive or nonconductive. Consequently, supply of a current from power supply terminal P1 to node N4 is stopped or reduced, thereby lowering internal supply voltage IVcc.

Conversely, if internal supply voltage IVcc becomes lower than reference voltage VR1, then the value of the current flowing through transistor Q21 becomes lower than that of the current flowing through transistor Q22. This causes a decrease in potential on node N5. Thus, transistor Q35 is rendered conductive, so that a sufficient current is supplied from power supply terminal P1 to node N4. This results in an increase in internal supply voltage IVcc.

In such a manner, a constant internal supply voltage Ivcc that is not dependent on the fluctuation of external supply voltage Vcc or the variation of load is obtained.

FIG. 38 shows a characteristic of the internal voltage down converting circuit. Internal supply voltage IVcc is set to 4V. If external supply voltage Vcc is equal to or lower than 4V, then internal supply voltage IVcc is equal to external supply voltage Vcc. Conversely, if external supply voltage Vcc is equal to or higher than 4V, then internal supply voltage IVcc becomes constant at 4V without depending on the value of external supply voltage Vcc.

FIG. 39 shows control timing of internal voltage down converting circuit 1a or 1b of FIG. 35. A period corresponding to a period that an externally applied row address strobe signal/RAS is at a logic high level is called a standby period. A period corresponding to a period that row address strobe signal/RAS is at a logic low level is called an active period. In the active period, DRAM 3 and peripheral circuit 4 operate, so that a current is consumed.

A control signal Φ1 attains a logic low level in response to a rising of low address strobe signal/RAS. This causes transistor Q25 in internal voltage down converting circuit 1a (see FIG. 37) to be turned on, thereby increasing a current supplying capability of internal voltage down converting circuit 1a. Accordingly, internal supply voltage IVcc 1 is kept constant.

Then, a sense amplifier activating signal SE rises to a logic high level. This causes sense amplifier SA in DRAM 3 to be activated. A control signal Φ2 attains a logic low level in response to the rising of sense amplifier activating signal SE. This turns transistor Q25 in internal voltage down converting circuit 1b (see FIG. 37) on, so that a current supplying capability of internal voltage converting circuit 1b increases and an internal supply voltage IVcc 2 is kept constant.

Referring to FIG. 39, a row system set current is a current that is produced by activation of each circuit during the period between the time that an address signal is input and the time that the potential on the word lines rises. A sense amplifier system current is a current which is produced by activation of CMOS sense amplifier SA. A column system current is a current that is produced by activation of each circuit during the period between the time that CMOS sense amplifier SA is activated and the time that data is output. A row system reset current is a current that is produced when row address strobe signal/RAS rises.

Control signal Φ1 for internal voltage down converting circuit 1a is at a logic low level during the active period. Control signal Φ2 for internal voltage down converting circuit 1b is at a logic low level only for a definite period after the activation of CMOS sense amplifier SA. This is because the sense amplifier system current flows only in charging/discharging of bit lines, i.e., upon the activation of the sense amplifier.

(2) Second Conventional Art (FIGS. 40-42)

FIG. 40 is a block diagram showing a conventional internal voltage down converting circuit using a level shift circuit. A level shift circuit 90 level-shifts an internal supply voltage IVcc output from driver circuit 30 from 4V to 2.4V and applies the level-shifted voltage to a differential amplifying circuit 20 in order to increase the sensitivity of circuit 20. In that case, a reference voltage VR1 generated from reference voltage generating circuit 10 is also set to 2.4V.

FIG. 41 shows detailed configurations of differential amplifying circuit 20, driver circuit 30 and level shift circuit 90. Differential amplifying circuit 20 is comprised of a current mirror circuit including P channel MOS transistors Q27 and Q28 and N channel MOS transistors Q29 and Q30. N channel MOS transistor Q31 has its gate supplied with a control signal φi or a supply voltage Vcc. Differential amplifying circuit 20 compares a voltage on a node N6 with reference voltage VR1, to turn transistor Q35 in driver circuit 30 on/off. Because of the characteristics of transistors Q29 and Q30, as a voltage level to be applied to transistors Q29 and Q30 becomes lower, the sensitivity of differential amplifying circuit 20 becomes higher. Accordingly, internal supply voltage IVcc to be supplied to node N4 is converted to 2.4V by level shift circuit 90 and then applied to node N6.

Level shift circuit 90 is a resistance dividing circuit comprised of P channel MOS transistors Q90 and Q91 as shown in FIG. 41, or a resistance dividing circuit comprised of resistors R1 and R2 as shown in FIG. 42.

An operation of the circuit of FIG. 41 will now be described. If internal supply voltage IVcc becomes equal to or lower than 4V, then an output of level shift circuit 90 becomes equal to or lower than 2.4V. At this time, since a voltage on node N6 is lower than reference voltage VR1, an output of a node N5 in differential amplifying circuit 20 attains a logic low level. Consequently, transistor Q35 of driver circuit 30 is turned on, so that external supply voltage Vcc is supplied to node N4.

If internal supply voltage IVcc becomes equal to or higher than 4V, then the output of level shift circuit 90 becomes equal to or higher than 2.4V. Thus, since the voltage on node N6 becomes higher than reference voltage VR1, the output of node N5 in differential amplifying circuit 20 attains a logic high level. Consequently, transistor Q35 of driver circuit 30 is turned off, so that no external supply voltage Vcc is supplied to node N4.

By repeating the foregoing operation, if external supply voltage Vcc is equal to or lower than 4V, then internal supply voltage IVcc is equal to external supply voltage Vcc. If external supply voltage Vcc becomes equal to or higher than 4V, then internal supply voltage IVcc becomes constant at 4V. Since level shift circuit 90 is the resistance dividing circuit, the turning on of transistor Q35 of driver circuit 30 causes a through-current to flow from a power supply terminal P1 to a ground terminal.

(3) Third Conventional Art (FIGS. 43-46)

FIG. 43 is a circuit diagram showing another example of a conventional internal voltage down converting circuit. A MOS-DRAM incorporating this internal voltage down converting circuit is disclosed in *IEEE JSSCC*, Vol. 23, No. 5, pp. 1128-1132, October 1988.

A voltage generating circuit 10a generates a reference voltage V1, and a voltage generating circuit 10b generates a reference voltage V2. A reference voltage generating circuit 10c receives reference voltages V1 and V2 to generate a reference voltage VL. Reference voltages V1, V2 and VL have such characteristics as shown in FIG. 45.

Like differential amplifying circuit 20 and driver circuit 30 shown in FIG. 41, a differential amplifying circuit 20 and a driver circuit 30 compare internal supply voltage IVcc with reference voltage VL to supply a constant internal supply voltage IVcc by a feedback loop. Referring to FIG. 43, reference characters J1 and J2 denote current sources.

FIG. 44 shows one example of the configuration of reference voltage generating circuit 10c. Reference voltage generating circuit 10c includes two current mirror amplifiers 11 and 12 and an output stage 13. Current mirror amplifier 11 includes P channel MOS transistors Q61 and Q62, N channel MOS transistors Q63 and Q64, and a current source J3. Current mirror amplifier 12 includes P channel MOS transistors Q65 and Q66, N channel MOS transistors Q67 and Q68, and a current source J4. Output stage 13 includes P channel MOS transistors Q69 and Q70 and resistors R3 and R4.

Current mirror amplifier 11 compares a voltage on a node N7 in output stage 13 with a reference voltage V1, to control transistor Q69. Current mirror amplifier 12 compares the voltage on node N7 in output stage 13 with reference voltage V1, to control transistor Q70. A reference voltage VL is generated from a node N8 in output stage 13.

FIG. 46 shows dependence of reference voltage VL and internal supply voltage IVcc on an external supply voltage. Internal supply voltage IVcc increases linearly until external supply voltage Vcc is set to 4V. Internal supply voltage IVcc becomes constant at 4V in the range of external supply voltage Vcc from 4V to 7V. Internal supply voltage IVcc increase linearly when external supply voltage Vcc becomes equal to or higher than 7V.

For a burn-in test (a voltage application accelerating test) of a semiconductor device incorporating the internal voltage down converting circuit with such characteristics, an external high supply voltage should be applied in the area where internal supply voltage IVcc fluctuates in a linear manner dependently on external supply voltage Vcc, in order to apply a high voltage to circuit elements of an internal circuit.

(1) Steadily consumed current (a current consumed in a DC manner) exists in such internal circuits as DRAM 3 and peripheral circuit 4 shown in FIG. 35. If an internal supply voltage is lowered by such a current, then transistor Q35 in driver circuit 30 is turned on (see FIG. 37). Accordingly, the internal supply voltage returns to 4V as shown in FIG. 47. At this time, a through-current flows from power supply terminal P1 to ground terminal P2 in differential amplifying circuit 20, so that a peak appears in current consumption. This results in an increase in current consumption.

Further, in the internal voltage down converting circuit of FIG. 37, transistor Q25 is turned off during the standby period as shown in FIG. 39, so that a current is supplied only by transistor Q26. In such a manner, the current supplying capability of differential amplifying circuit 20 is decreased, thereby decreasing power consumption. However, there is such a disadvantage that power consumption cannot be decreased to a large extent.

(2) In peripheral circuit 4 shown in FIG. 35, since a current is consumed in the active period, the current supplying capability of differential amplifier 20 in internal voltage down converting circuit 1a must be increased by setting control signal Φ1 in a logic low level in the active period, as shown in FIG. 39. Thus, power consumed in differential amplifier 20 increases with an increase in duration of the active period.

In internal voltage down converting circuit 1b shown in FIG. 35, control signal Φ2 is at a logic low level only during a definite period after activation of the sense amplifier in the active period, thereby increasing the current supplying capability of circuit 1b as shown in FIG. 39. After that, a current is supplied only by transistor Q26 shown in FIG. 37. In this case, there is such a disadvantage that power consumption cannot be reduced to a large extent as described in the foregoing.

(3) Since power consumption differs between DRAM 3 and peripheral circuit 4 even in the same active period, it is necessary to reduce the power consumption for each internal circuit.

(4) In internal voltage down converting circuit 1b shown in FIG. 35, the current supplying capability is increased only for a definite period after activation of the sense amplifier in the active period as shown in FIG. 39. However, current consumption in a refresh cycle is different from that in a normal cycle. Particularly, as the time period of the refresh cycle increases, an operation current in internal voltage down converting circuit 1b increases, resulting in an increase in current flowing at the time of refresh.

(5) For the burn-in test in a semiconductor device incorporating the internal voltage down converting circuit of FIG. 43, it is necessary to apply a considerably high external supply voltage of 7V or more to the external power supply terminal in order to apply a high voltage to the internal circuit. In that case, the high external supply voltage is applied as it is to such an internal circuit as output buffer 5 which is inherently directly driven by external supply voltage Vcc. This results in a danger that circuit elements of the internal circuit are liable to be destroyed.

(6) In the internal voltage down converting circuit shown in FIGS. 40–42, a through-current flows through level shift circuit 90 as described above. Thus, it is necessary to set a smaller current to flow through level shift circuit 90 in order to prevent an increase in power consumption. This results in slower response of an output of level shift circuit 90 to the fluctuation of internal supply voltage IVcc.

Further, since a fluctuation width of internal supply voltage IVcc is resistance-divided, an input amplitude of differential amplifying circuit 20 becomes smaller. This results in such a problem that the internal voltage down converting circuit fails to achieve a very high sensitivity despite the fact that the circuit includes level shift circuit 90.

(7) A semiconductor device including no internal voltage down converting circuit has only a single power supply line L1 on a chip ch as shown in FIG. 48. This power supply line L1 is connected to a power supply pad pVcc that receives external power supply voltage Vcc. This makes it possible to monitor a potential on power supply line L1 from power supply pad pVcc. A reference character CIR denotes a circuit region.

However, a semiconductor device incorporating an internal voltage down converting circuit has an external power supply line and an internal power supply line on a chip. The external power supply line is connected to a power supply pad, whereas the internal power supply line is not connected to the pad. Thus, a direct probing onto the internal power supply line is required in order to monitor a potential on the internal power supply line.

Therefore, there is such a disadvantage that the potential on the internal power supply line cannot be monitored in a molded semiconductor device.

SUMMARY OF THE INVENTION

One object of the present invention is to reduce power consumption of an internal voltage down converting circuit while stably supplying an internal power supply voltage to an internal circuit.

Another object of the present invention is to sufficiently reduce power consumption of an internal voltage down converting circuit even if an internal circuit requires a longer active period.

A further object of the present invention is to reduce power consumption to a minimum extent when an internal power supply voltage is applied to a plurality of internal circuits carrying out different operations.

A still further object of the present invention is to prevent an increase in refresh current when a longer refresh cycle period is required in a storage device driven by an internal power supply voltage.

A still further object of the present invention is to perform a highly efficient acceleration test for a semiconductor device including an internal voltage down converting circuit without destroying circuit elements.

A still further object of the present invention is to improve the sensitivity of an internal voltage down converting circuit.

A still further object of the present invention is to monitor a potential on an internal power supply line without a direct probing onto the internal power supply line.

(1) A semiconductor device according to the present invention includes an internal voltage down converting circuit for down-converting an external power supply voltage to a predetermined internal power supply voltage, and an internal circuit driven by an internal power supply voltage.

The internal voltage down converting circuit includes a first voltage supplying circuit, a second voltage supplying circuit and a control circuit. The first voltage supplying circuit includes a first conductive channel type field effect device and responds to a first reference voltage to feedback-control the first conductive channel type field effect device, thereby to supply an internal power supply voltage to the internal circuit. The second voltage supplying circuit includes a second conductive channel type field effect device which responds to a second reference voltage to output an internal power supply voltage, thereby to supply the output internal power supply voltage to the internal circuit. The control circuit controls activation and inactivation of the first voltage supplying circuit.

Preferably, the control circuit controls the activation and inactivation of the first voltage supplying circuit in accordance with the amount of power consumption of the internal circuit.

The internal circuit performs an operation having an active period and a standby period. Preferably, the control circuit activates the first voltage supplying circuit in the active period and inactivates the first voltage supplying circuit in the standby period.

In the first voltage supplying circuit, a through-current flows by ON/OFF control of the first conductive channel type field effect device, and a peak appears in current consumption; however, a high capability of supplying a current is obtained. In the second voltage supplying circuit, a high capability of supplying a current cannot be obtained; however, no through-current flows or no peak appears in current consumption.

Normally, an internal power supply voltage is supplied only by the second voltage supplying circuit to the internal circuit. This makes it possible to arbitrarily compensate a current that is steadily consumed in the internal circuit. Accordingly, the internal supply voltage is hardly decreased, and no peak is produced in current consumption. The first voltage supplying circuit is activated in the operation of the internal circuit. This makes it possible to compensate an operation current flowing through the internal circuit.

The internal supply voltage can be stably supplied to the internal circuit, and power consumption is reduced. This results in provision of a semiconductor device including an internal voltage down converting circuit with higher performance and lower power consumption.

(2) A semiconductor device according to another aspect of the present invention includes an internal voltage down converting circuit for down-converting an external supply voltage to a predetermined internal power supply voltage, an internal circuit driven by an internal power supply voltage, and a control circuit for controlling the internal voltage down converting circuit. The internal circuit carries out an operation having an active period and a standby period.

The internal voltage down converting circuit includes a first voltage supplying circuit and a second voltage supplying circuit. The first voltage supplying circuit includes a first conductive channel type field effect device and responds to a first reference voltage to feedback-control the first conductive channel type field effect device, thereby to supply an internal power supply voltage to the internal circuit. The second voltage supplying circuit includes a second conductive channel type field effect device that responds to a second reference voltage to output an internal power supply voltage, thereby to supply the output internal power supply voltage to the internal circuit.

The control circuit activates the first voltage supplying circuit in the active period and inactivates the first voltage supplying circuit in the standby period. Further, the control circuit inactivates the first voltage supplying circuit when the operation of the internal circuit is in a steady state in the active period.

The internal power supply voltage is supplied by the second voltage supplying circuit to the internal circuit in the standby period. This makes it possible to compensate a current flowing steadily through the internal circuit. In the active period, the internal power supply voltage is supplied by the first and second voltage supplying circuits to the internal circuit. This makes it possible to compensate an operation current flowing through the internal circuit. Further, if the operation of the internal circuit becomes steady in the active period, then the first voltage supplying circuit is inactivated. Thus, power consumption can be sufficiently reduced even in a longer active period.

This results in provision of a semiconductor device with higher performance and lower power consumption.

(3) A semiconductor device according to still another aspect of the present invention includes a plurality of internal voltage down converting circuits for down-converting an external power supply voltage to predetermined internal power supply voltages, a plurality of internal circuits each corresponding to the plurality of internal voltage down converting circuits, and a control circuit for controlling the plurality of internal voltage down converting circuits. Each of the internal circuits is driven by its corresponding internal power supply voltage to perform an operation having an active period and a standby period.

Each of the internal voltage down converting circuits includes a first voltage supplying circuit and a second voltage supplying circuit. The first voltage supplying circuit includes a first conductive channel type field effect device and responds to a first reference voltage to feedback-control the first conductive channel type field effect device thereby to supply an internal power supply voltage to the internal circuit. The second voltage supplying circuit includes a second conductive channel type field effect device that responds to a second reference voltage to output an internal power supply voltage thereby to supply the output internal power supply voltage to the internal circuit. The plurality of internal circuits carry out different operations.

The control circuit activates the first voltage supplying circuit of each internal voltage down converting circuit in the active period and inactivates the first voltage supplying circuit of each internal voltage down converting circuit in the standby period. Further, the control circuit inactivates the corresponding first voltage supplying circuit when the operation of each internal circuit is in a steady state in the active period.

When the operation of each internal circuit is in a steady state in the active period, its corresponding first voltage supplying circuit is inactivated. Thus, power consumption is minimized when respective internal power supply voltages are supplied to the plurality of internal circuits performing different operations.

This results in provision of a semiconductor device with higher performance and lower power consumption.

(4) A semiconductor device according to still another aspect of the present invention includes an internal voltage down converting circuit for down-converting an external power supply voltage to a predetermined internal power supply voltage, a dynamic storage device driven by an internal power supply voltage, and a control circuit for activating the internal voltage down converting circuit only for a minimum time period required to refresh the storage device during the period of a refresh operation.

The storage device includes a memory including a plurality of memory cells for storing data therein, a selecting circuit for selecting a memory cell to be refreshed, and a sense amplifier for amplifying data read from the selected memory cell. The internal voltage down converting circuit supplies an internal power supply voltage to the sense amplifier. Preferably, the control circuit activates the internal voltage down converting circuit for only a minimum time period required to refresh the selected memory cell in the period of the refresh operation.

Preferably, the control circuit includes a first signal generating circuit responsive to the start of refresh of the selected memory cell for generating a first signal, a second signal generating circuit responsive to the completion of refresh of the selected memory cell for generating a second signal, and a control signal generating circuit for generating a control signal which is activated in response to the first signal and inactivated in response to the second signal.

In the refresh period of the dynamic storage device, the internal voltage down converting circuit is activated only by a minimum time period required for the refresh, while it is inactivated after a restoring operation is completed. Accordingly, an unnecessary current does not flow at the time of refresh irrespectively of the length of a refresh cycle. This enables a reduction in current flowing in the refresh time. A semiconductor device with higher performance and lower power consumption is thus obtained.

(5) A semiconductor device according to still another aspect of the present invention includes a power supply terminal for receiving an external power supply voltage, an internal voltage down converting circuit for down-converting the external power supply voltage to a predetermined internal power supply voltage, an internal circuit driven by an internal power supply voltage, a switch circuit provided between the power supply terminal and the internal circuit, and a control circuit.

The control circuit activates the internal voltage down converting circuit and turns the switch circuit off in a normal operation, while it inactivates the internal voltage down converting circuit and turns the switch circuit on in a test.

The semiconductor device externally receives a control signal for controlling the internal circuit. Preferably, the control circuit performs a control for a test when the timing of the control signal is predetermined timing different from that in the normal operation.

The semiconductor device further includes a circuit for externally receiving a control signal for controlling the internal circuit, and an external terminal for receiving a predetermined signal or a predetermined potential. The control circuit preferably performs the control for a test when the timing of the control signal is predetermined timing different from that in the normal operation and a voltage level of the external terminal is a predetermined voltage level different from that in the normal operation.

In the test, the external power supply voltage is supplied directly to the internal circuit. This makes it possible to supply a high voltage necessary for the test to the internal circuit without externally supplying an overvoltage. Therefore, a highly efficient acceleration test can be carried out without destruction of circuit elements.

If the switch circuit is turned on by use of different timing of a control signal from that in the normal operation or a different voltage level from a normal voltage level, then an erroneous application of a high voltage to the internal circuit in the normal operation is avoided. This makes it possible to conduct a safe, stable and highly efficient acceleration test for the semiconductor device incorporating the internal voltage down converting circuit.

(6) A semiconductor device according to still another aspect of the present invention includes an internal voltage down converting circuit for down-converting an external power supply voltage to a predetermined internal power supply voltage, and an internal circuit driven by an internal power supply voltage.

The internal voltage down converting circuit includes a reference voltage generating circuit for generating a reference voltage in response to an external supply voltage, a driver circuit for supplying an internal power supply voltage to the internal circuit, a level shift circuit for level-shifting an output of the driver circuit, an amplifier circuit for amplifying an output amplitude of the level shift circuit, and a differential amplifier circuit for differentially amplifying the reference voltage and an output of the amplifier circuit. The driver circuit is controlled by an output of the differential amplifier circuit.

An output of the driver circuit is shifted to a voltage level at which the differential amplifier circuit achieves a higher sensitivity, and an amplitude of the shifted voltage is amplified. This leads to an increase in the difference between input levels of the differential amplifier circuit and an increase in sensitivity of the internal voltage down converting circuit. A semiconductor device with higher performance is thus obtained.

(7) A semiconductor device according to still another aspect of the present invention includes an internal power supply line supplied with an internal power supply voltage, an external pad for receiving a predetermined signal or a predetermined potential, and a monitor. The monitor includes a transistor connected between the external pad and the internal power supply line and having a known threshold voltage.

A method of monitoring a potential on an internal power supply line according to still another aspect of the present invention includes the step of calculating the potential on the internal power supply line on the basis of a voltage of the external pad and a threshold voltage of the transistor connected between the external pad and the internal power supply line.

This makes it possible to monitor the potential on the internal power supply line without a direct probing to the internal power supply line. This enables monitoring of the potential on the internal power supply line in a molded semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (1). A First Embodiment (FIGS. 1-21)

Figure 1:
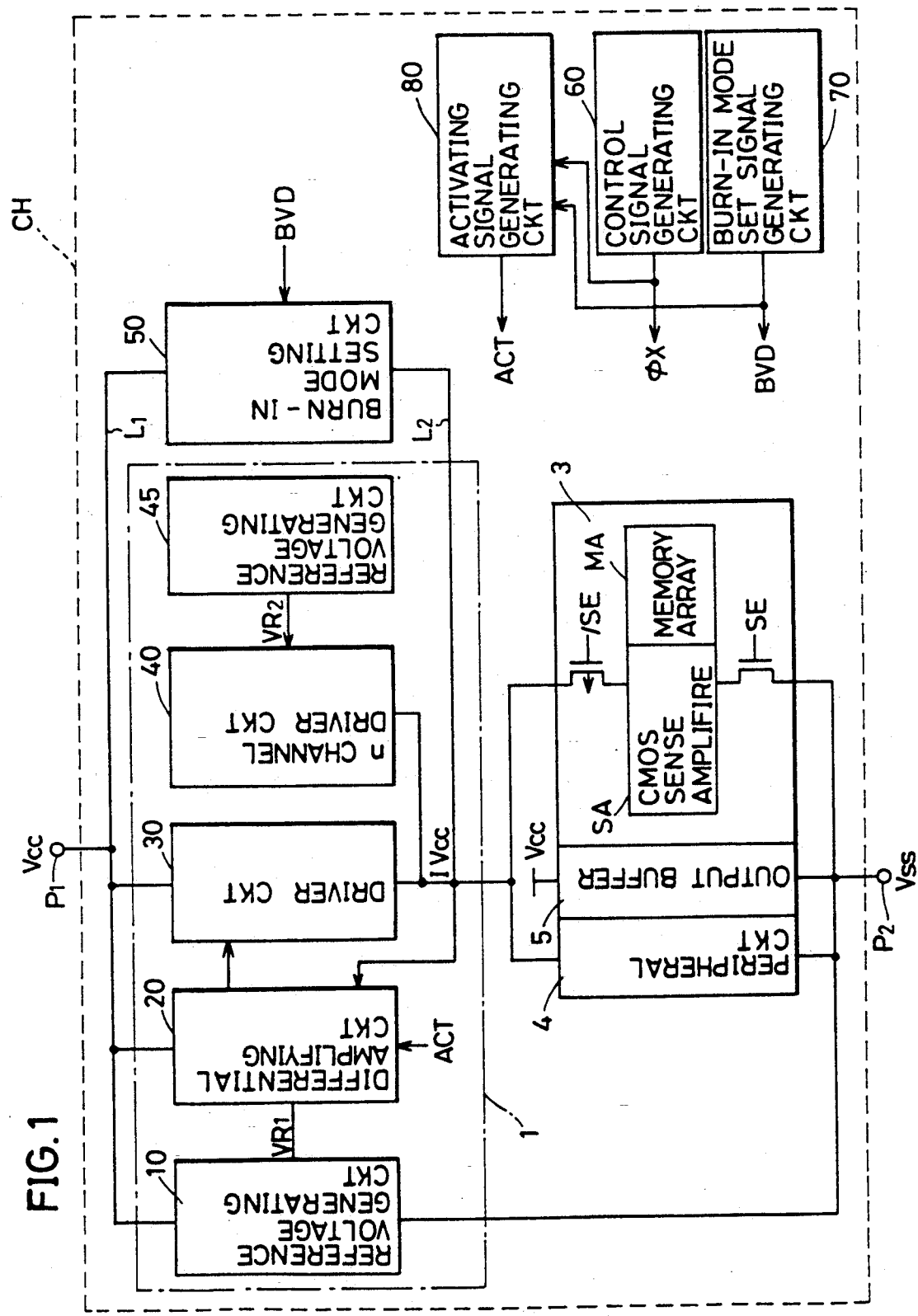
FIG. 1 is a block diagram showing structure of a semiconductor device according to a first embodiment of the present invention.

(a) Overall Structure and Schematic Operation (FIG. 1)

FIG. 1 is a block diagram showing structure of a semiconductor device according to the first embodiment of the present invention. A semiconductor device CH includes an internal voltage down converting circuit 1, a DRAM 3, a peripheral circuit 4 and an output buffer 5. Internal voltage down converting circuit 1 down-converts an external supply voltage Vcc to an internal supply voltage IVcc and supply the down-converted voltage to both DRAM 3 and peripheral circuit 4. Output buffer 5 is driven by external supply voltage Vcc.

Like the conventional internal voltage down converting circuit, internal voltage down converting circuit 1 includes a reference voltage generating circuit 10 for generating a reference voltage VR1, a differential amplifying circuit 20 and a driver circuit 30 and further includes an n channel driver circuit 40 and a reference voltage generating circuit 45. Reference voltage generating circuit 45 generates a reference voltage VR2 to supply the same to n channel driver circuit 40. n channel driver circuit 40 receives reference voltage VR2 to generate internal supply voltage IVcc as will be described later.

A burn-in mode setting circuit 50 is connected between an external power supply line L1 supplied with external supply voltage Vcc and an internal power supply line L2 supplied with internal supply voltage IVcc. Burn-in mode setting circuit 50 is controlled by a burn-in mode set signal BVD generated from a burn-in mode set signal generating circuit 70.

Differential amplifying circuit 20 is controlled by an activating signal ACT generated from an activating signal generating circuit 80. Activating signal generating circuit 80 generates activating signal ACT in response to a control signal φX generated from control signal generating circuit 60 and burn-in mode set signal BVD generated from burn-in mode set signal generating circuit 70.

In a normal mode (normal operation), burn-in mode setting circuit 50 is inactivated by burn-in mode set signal BVD. At that time, differential amplifying circuit 20 is supplied with control signal φX from control signal generating circuit 60 as activating signal ACT. Thus, differential amplifying circuit 20 is controlled by control signal φX. Normally, n channel driver circuit 40 supplies internal supply voltage IVcc. In operation of DRAM 3 and peripheral circuit 4, differential amplifying circuit 20 is activated, so that an insufficient supplying capability of n channel driver circuit 40 is complemented by driver circuit 30.

In a burn-in mode (burn-in test), burn-in mode setting circuit 50 is activated, and differential amplifying circuit 20 is inactivated. This causes external voltage Vcc of external power supply line L1 to be directly applied to internal power supply line L2.

Figure 37:
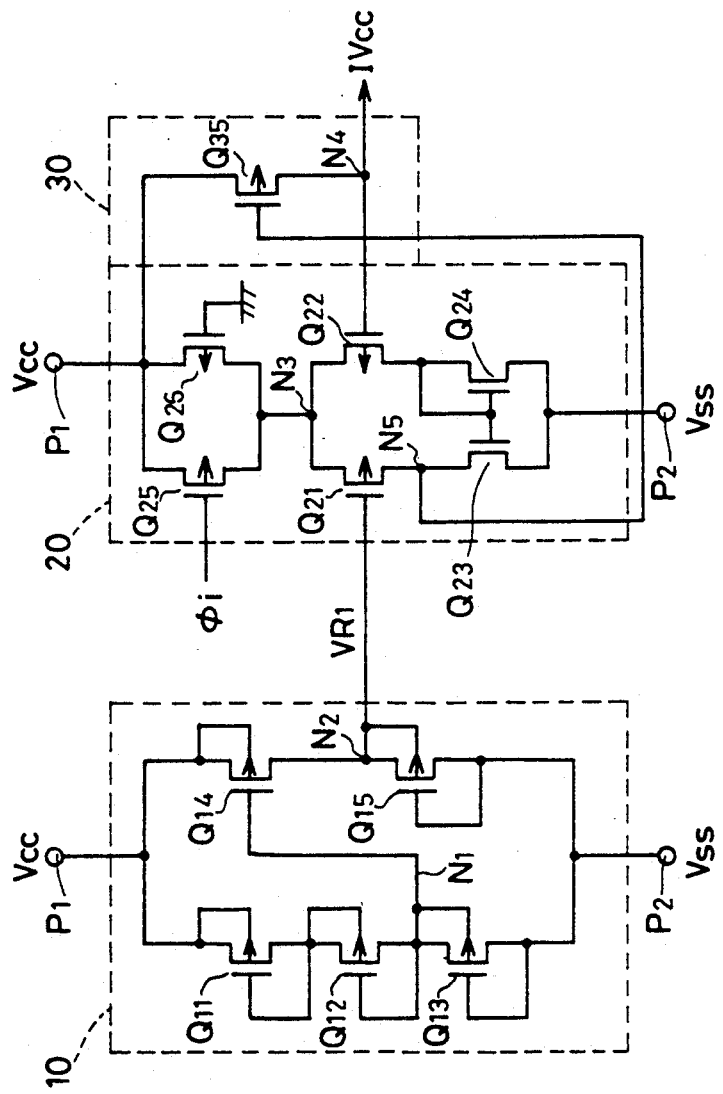
FIG. 37 is a circuit diagram showing a detailed configuration of the internal voltage down converting circuit.
Figure 38:
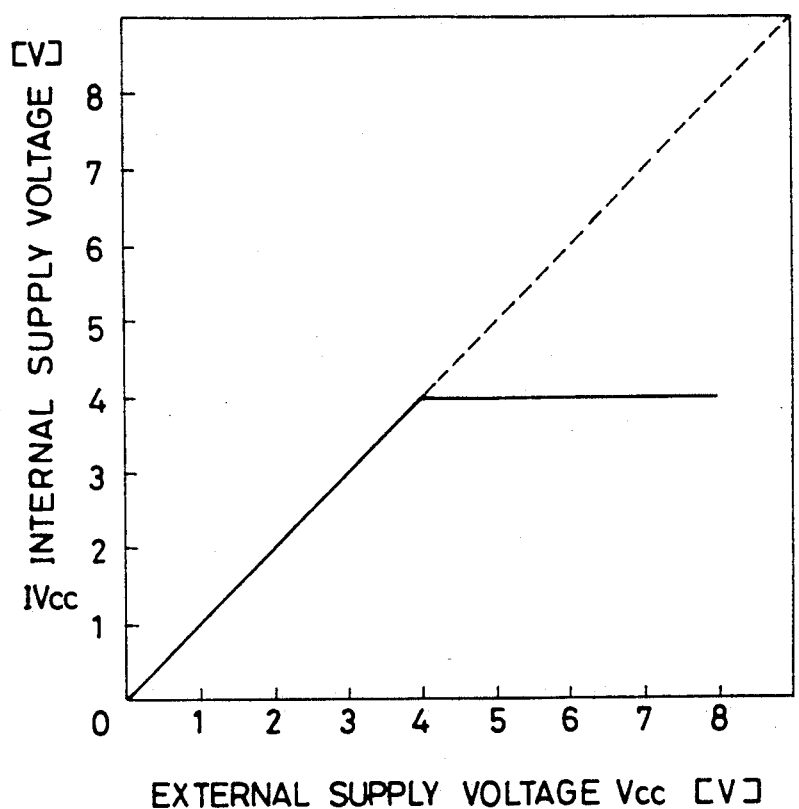
FIG. 38 is a diagram showing voltage characteristics of the internal voltage down converting circuit.
Figure 39:
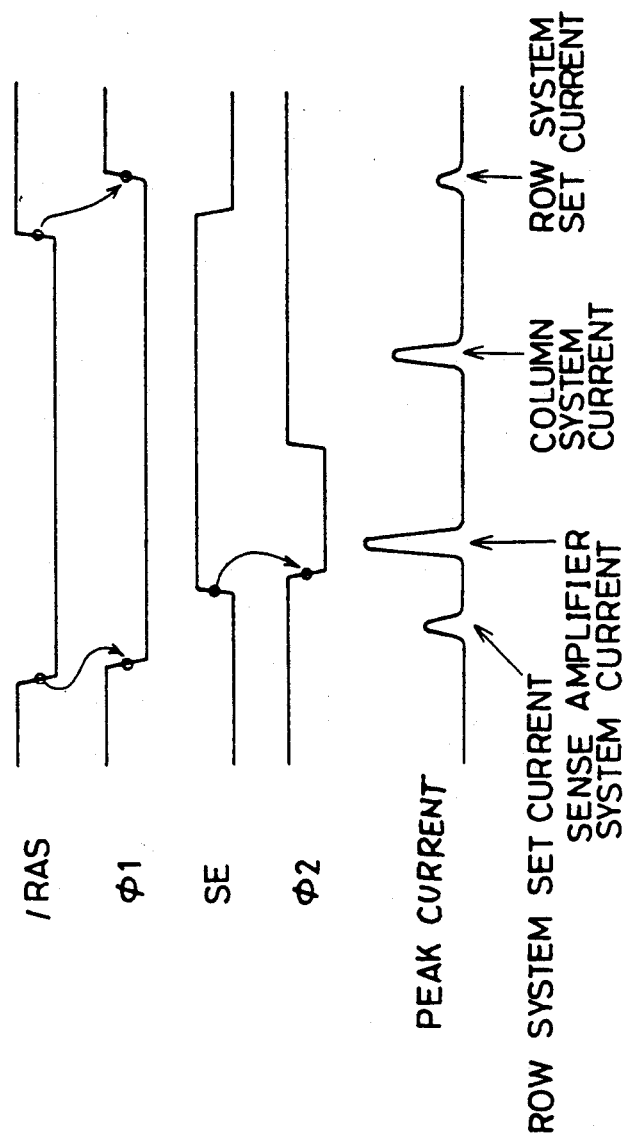
FIG. 39 is a waveform diagram for use in explaining an operation of the internal voltage down converting circuit of FIG. 35.
Figure 41:
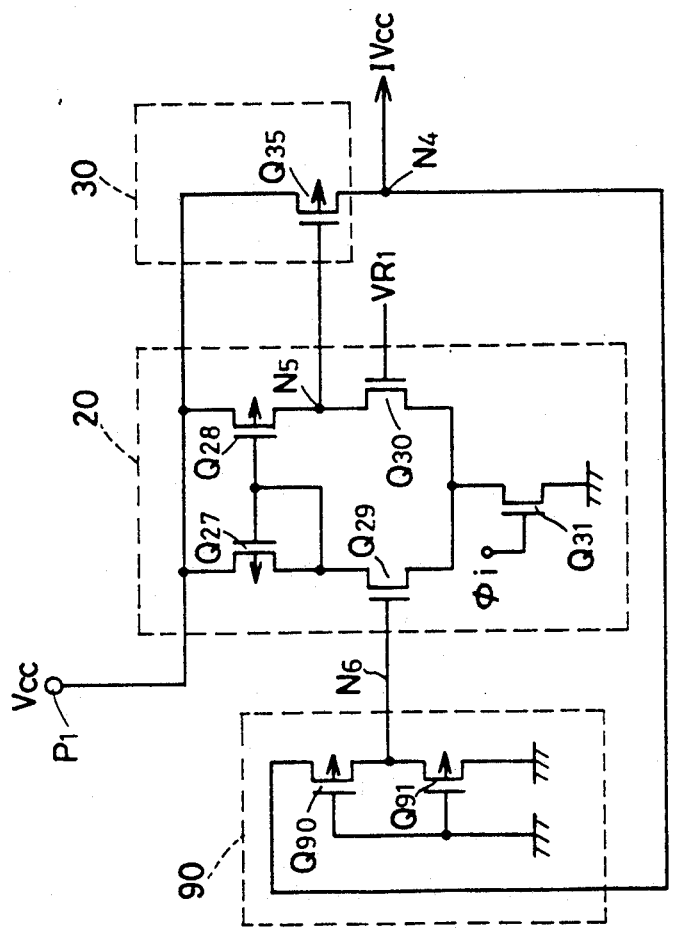
FIG. 41 is a circuit diagram showing detailed configuration of a part of the internal voltage down converting circuit of FIG. 40.
Figure 42:
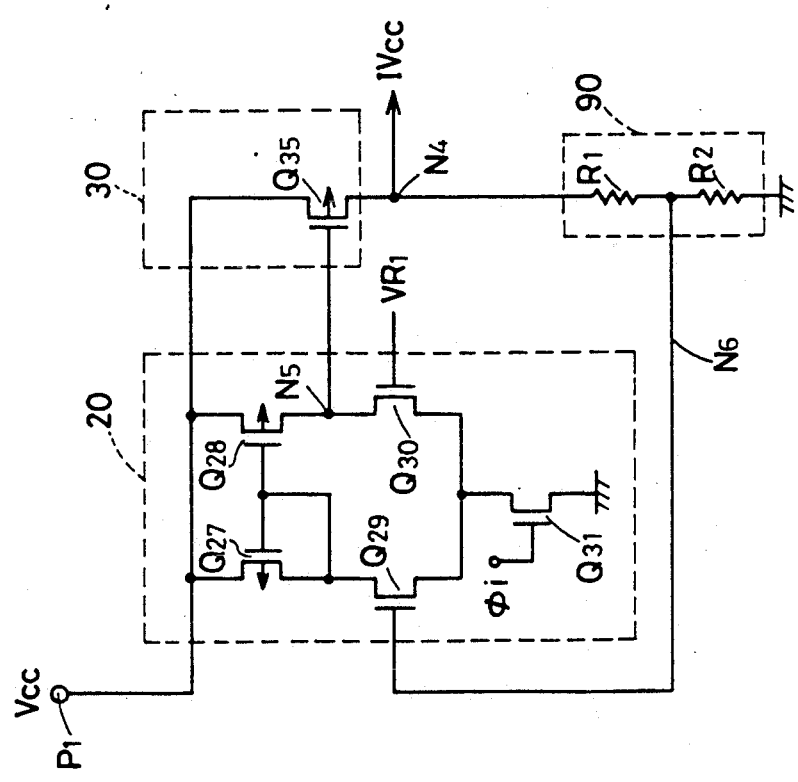
FIG. 42 is a circuit diagram showing another example of the configuration of the internal voltage down converting circuit.
Figure 43:
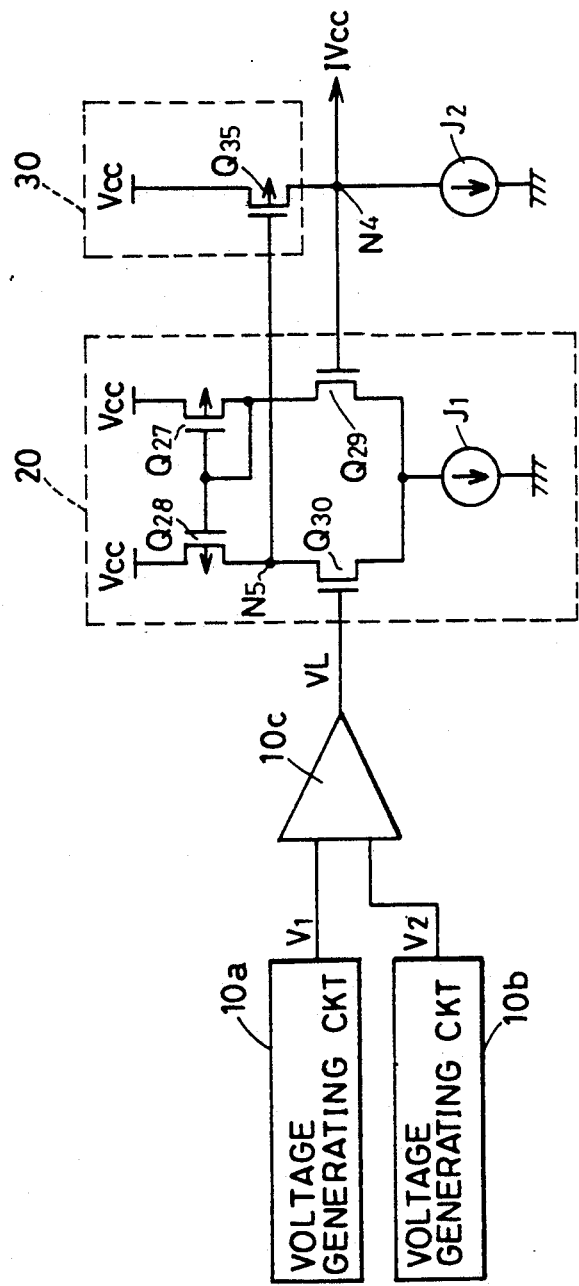
FIG. 43 is a circuit diagram showing configuration of a conventional internal voltage down converting circuit available for a burn-in test.
Figure 44:
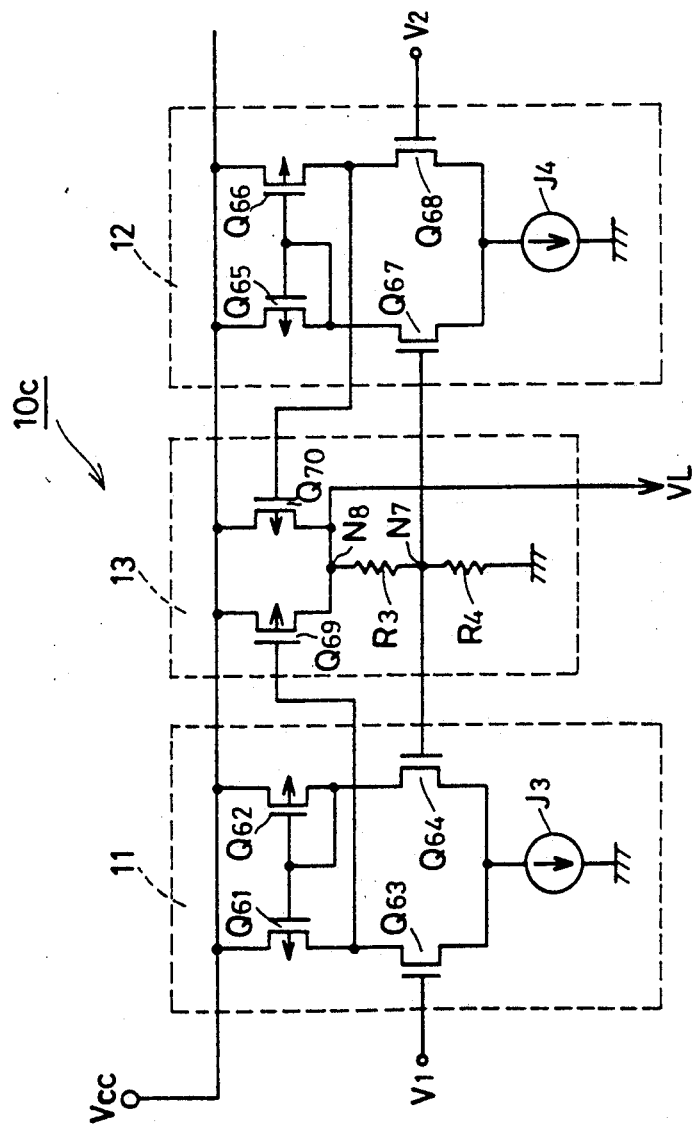
FIG. 44 is a circuit diagram showing a detailed configuration of a reference voltage generating circuit.
Figure 45:
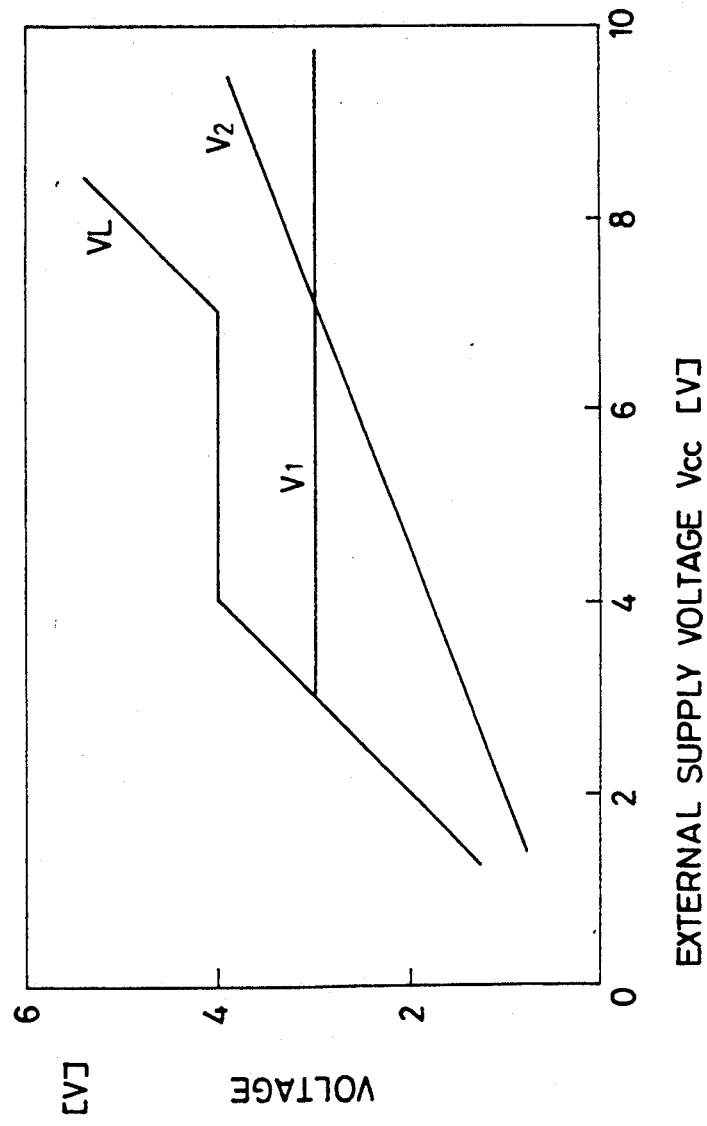
FIG. 45 is a diagram showing dependence of a reference voltage on an external power supply voltage in the internal voltage down converting circuit of FIG. 43.
Figure 46:
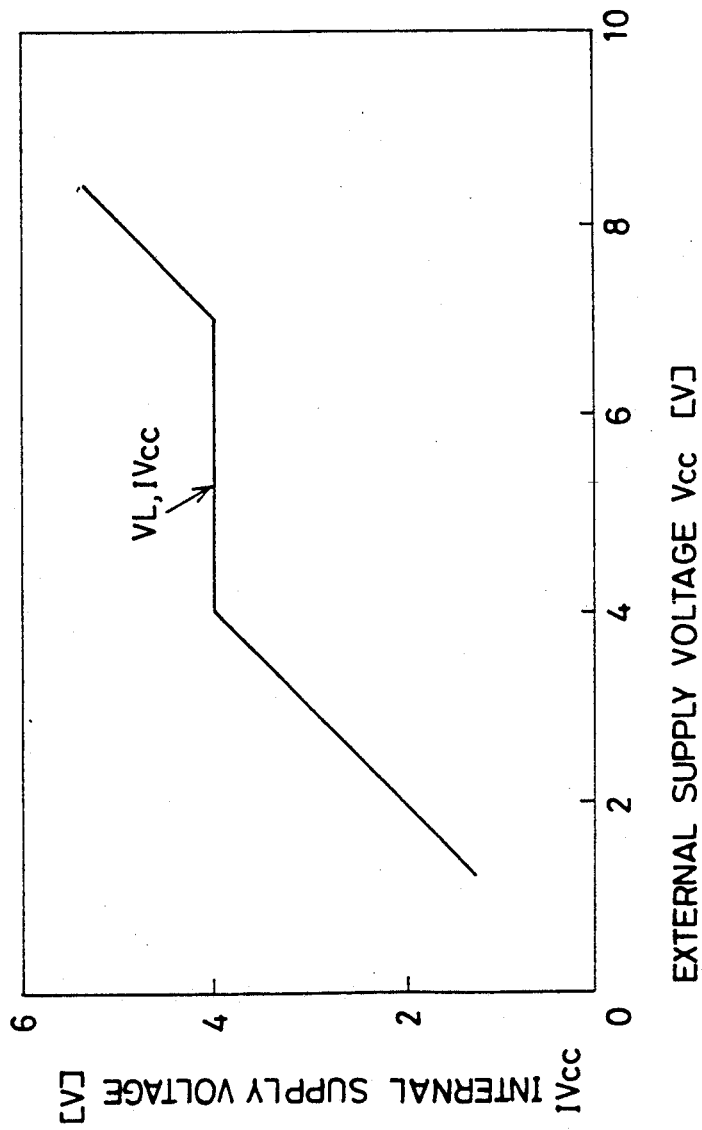
FIG. 46 is a diagram showing characteristics of an internal power supply voltage in the internal voltage down converting circuit of FIG. 43.
Figure 47:
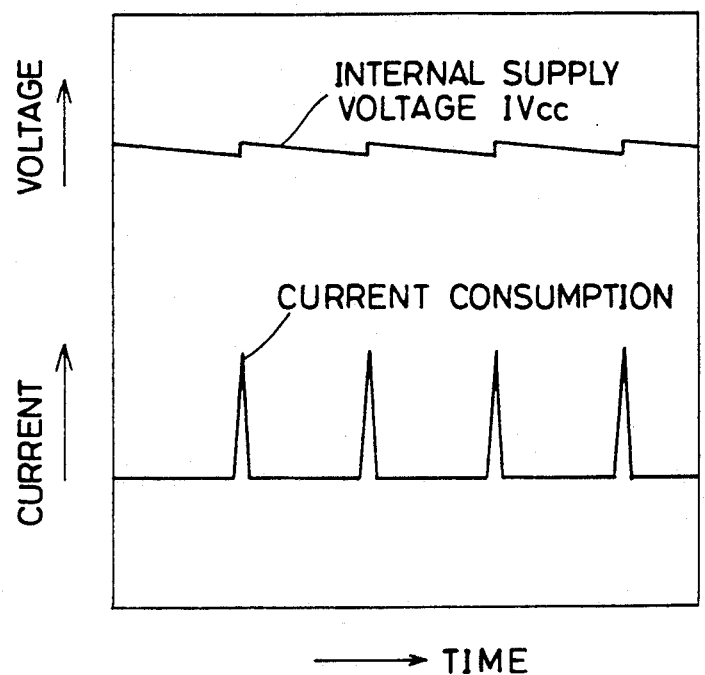
FIG. 47 is a diagram for use in explaining disadvantages of the conventional internal voltage down converting circuit.
Figure 48:
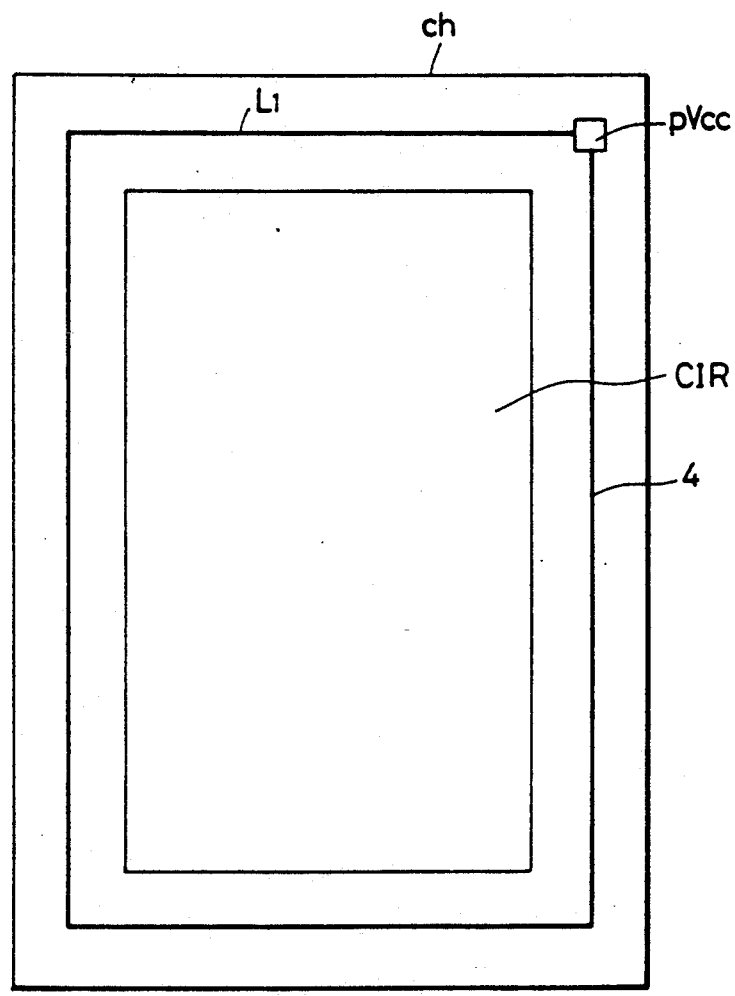
FIG. 48 is a schematic diagram showing a structure on a chip of a semiconductor device having no internal power supply line.

The configuration of reference voltage generating circuit 10 and driver circuit 30 is identical to that shown in FIG. 37. The configuration of differential amplifying circuit 20 is identical to that shown in FIG. 41. In this case, activating signal ACT is applied to a gate of a transistor Q31.

The configuration shown in FIG. 37 may be employed as the configuration of differential amplifying circuit 20. However, transistor Q26 is not provided, and the logic of control signal φX is opposite.

Figure 2:
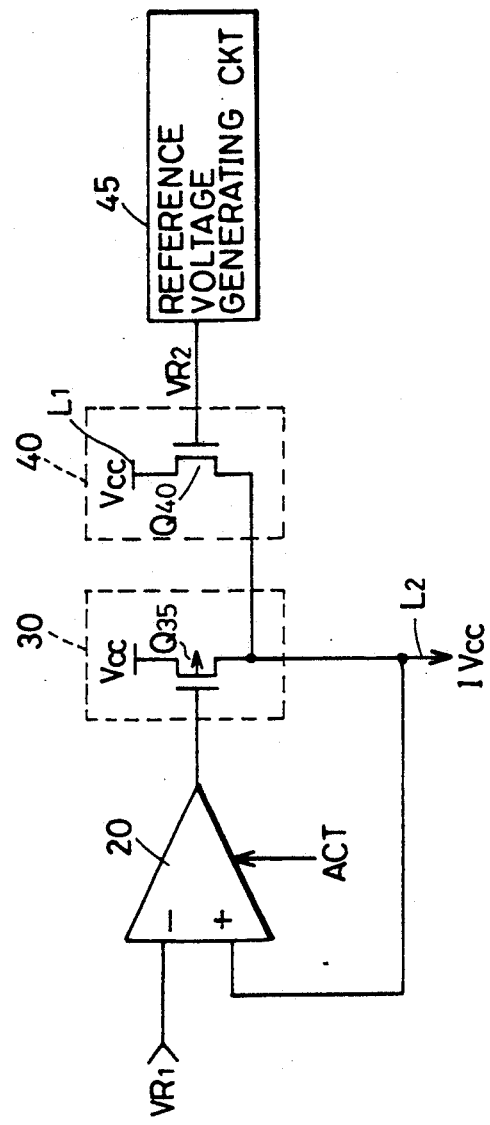
FIG. 2 is a circuit diagram showing configuration of a part of an internal voltage down converting circuit.
Figure 3:
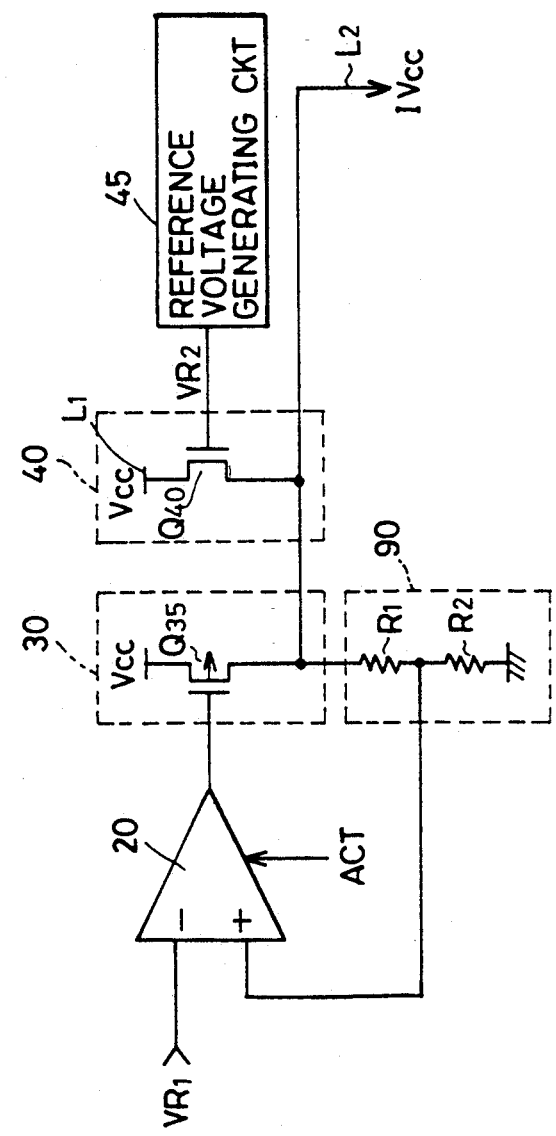
FIG. 3 is a circuit diagram showing another example of the internal voltage down converting circuit.
Figure 4:
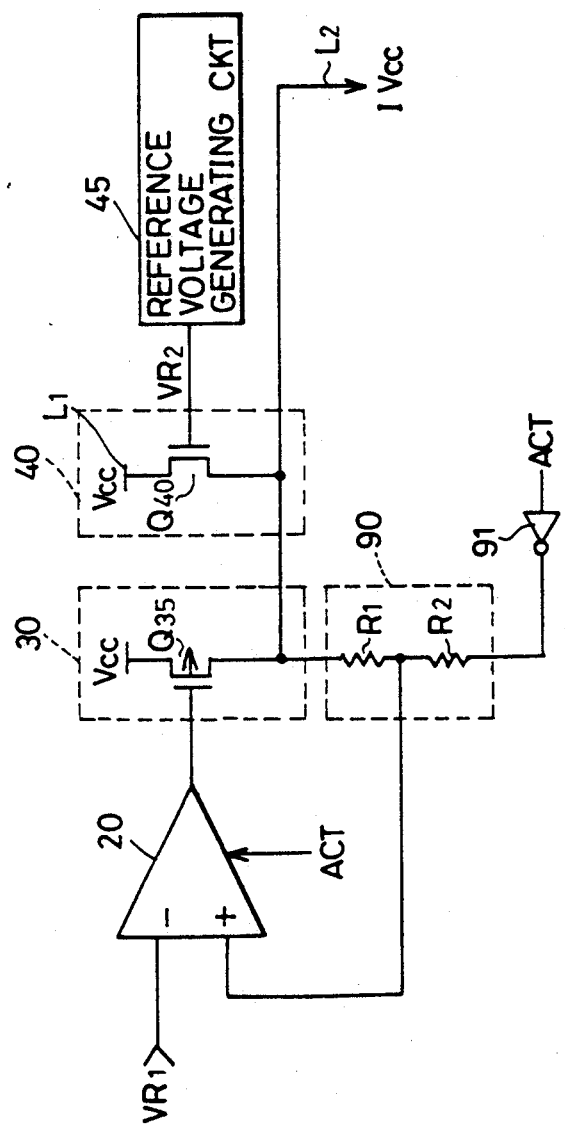
FIG. 4 is a circuit diagram showing still another example of the internal voltage down converting circuit.

(b) The Details of Internal Voltage Down Converting Circuit 1 (FIGS. 2-4)

FIG. 2 shows in detail the configuration of part of internal voltage down converting circuit 1. n channel driver circuit 40 includes an N channel MOS transistor Q40. Transistor Q40 is a source follower transistor and connected in parallel to a transistor Q35 of driver circuit 30. Transistor Q40 has its gate supplied with reference voltage VR2. Reference voltage VR2 is set as shown in the following equation:

$$VR2 = IVcc + Vth$$

wherein Vth is a threshold voltage of transistor Q40. Since the relation VR1=IVcc is satisfied, reference voltage VR2 is set to (4+Vth)V if reference voltage VR1 is 4V.

Since transistor Q40 operates in a saturation region, it can always supply a constant internal supply voltage IVcc although its current supplying capability is lower. This makes it possible to compensate for the current that is steadily consumed in DRAM 3 and peripheral circuit 4. In the operation of DRAM 3 and peripheral circuit 4, differential amplifier 20 is activated, so that internal supply voltage IVcc is supplied by both driver circuit 30 and n channel driver circuit 40.

As shown in FIG. 3, a level shift circuit 90 may be provided to shift the level of an output voltage of driver circuit 30 and apply the level-shifted output voltage to differential amplifying circuit 20. Further, as shown in FIG. 4, activating signal ACT may be applied via an invertor 91 to level shift circuit 90. In this case, if activating signal ACT attains a logic high level, then an output of invertor 91 attains a logic low level. Thus, level shift circuit 90 is activated. Conversely, if activating signal ACT attains a logic low level, then the output of invertor 91 attains a logic high level. Thus, level shift circuit 90 is inactivated.

As described above, level shift circuit 90 is also activated in the activation of differential amplifier 20, while level shift circuit 90 is also inactivated in the inactivation of differential amplifier 20. Thus, power consumption can further be reduced when differential amplifying circuit 20 and level shift circuit 90 are rendered inactivate in a standby state.

(c) Control Signal Generating Circuit 60 and Control Operation (FIGS. 5-8)

Figure 5:
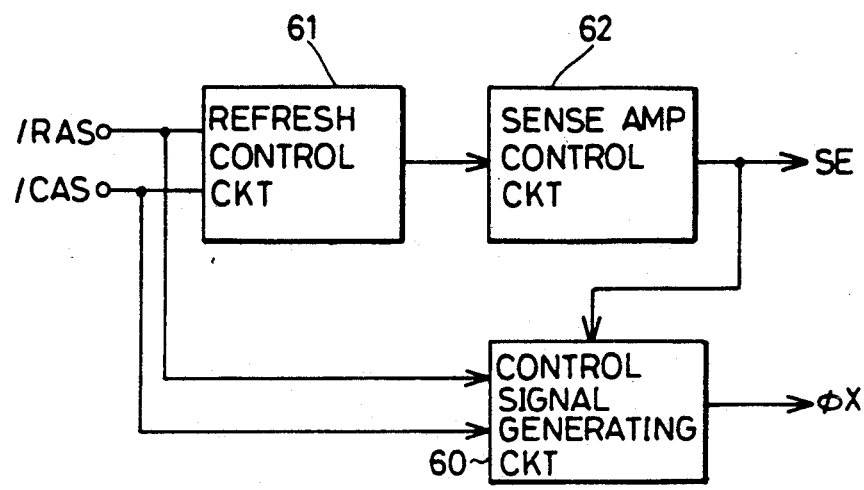
FIG. 5 is a block diagram for use in explaining an operation of a control signal generating circuit.

As shown in FIG. 5, a refresh control circuit 61 responds to an externally applied row address strobe signal/RAS and an externally applied column address strobe signal/CAS to apply a control signal to a sense amplifier control circuit 62. Sense amplifier control circuit 62 responds to the applied control signal to generate a sense amplifier activating signal SE. Control signal generating circuit 60 responds to row address strobe signal/RAS, column address strobe signal/CAS and sense amplifier activating signal SE to generate a control signal $\phi X$.

Figure 6:
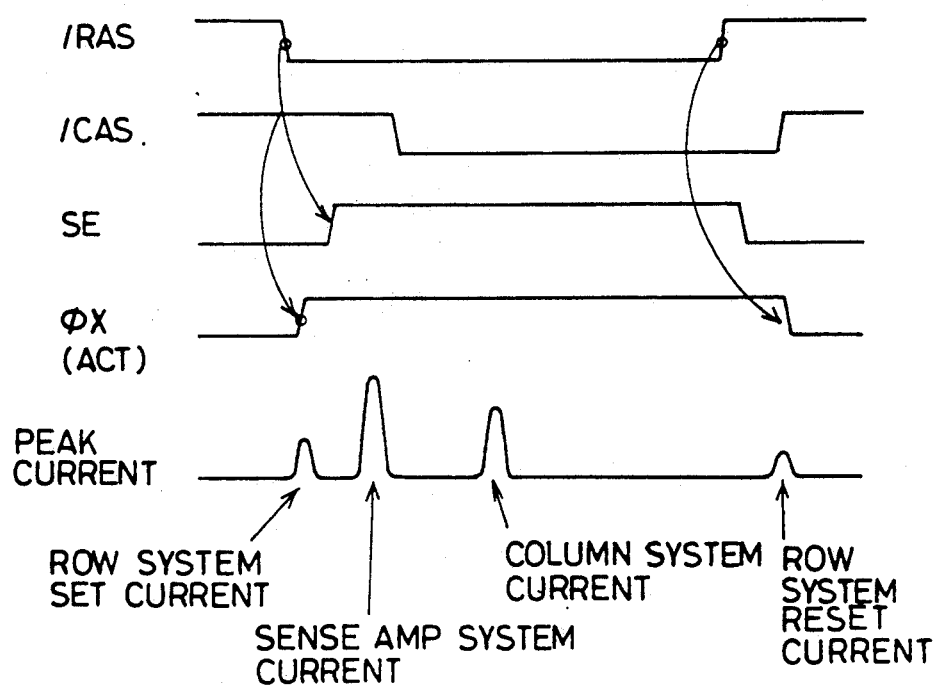
FIG. 6 is a waveform diagram for use in explaining a control operation in a normal cycle in a normal mode.
Figure 7:
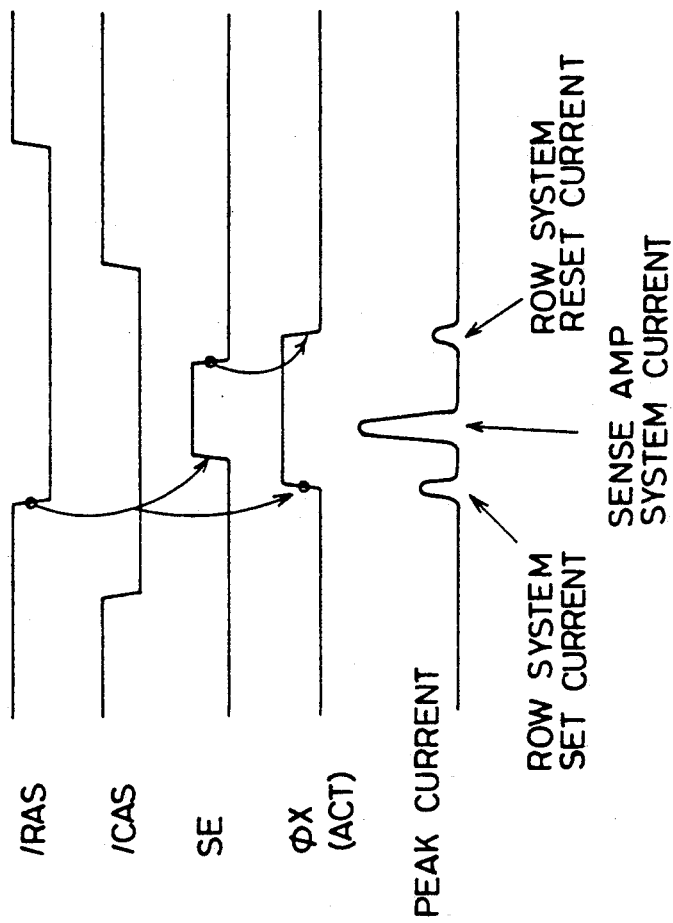
FIG. 7 is a waveform diagram for use in explaining a control operation in a CAS before RAS refresh cycle in a normal mode.
Figure 8:
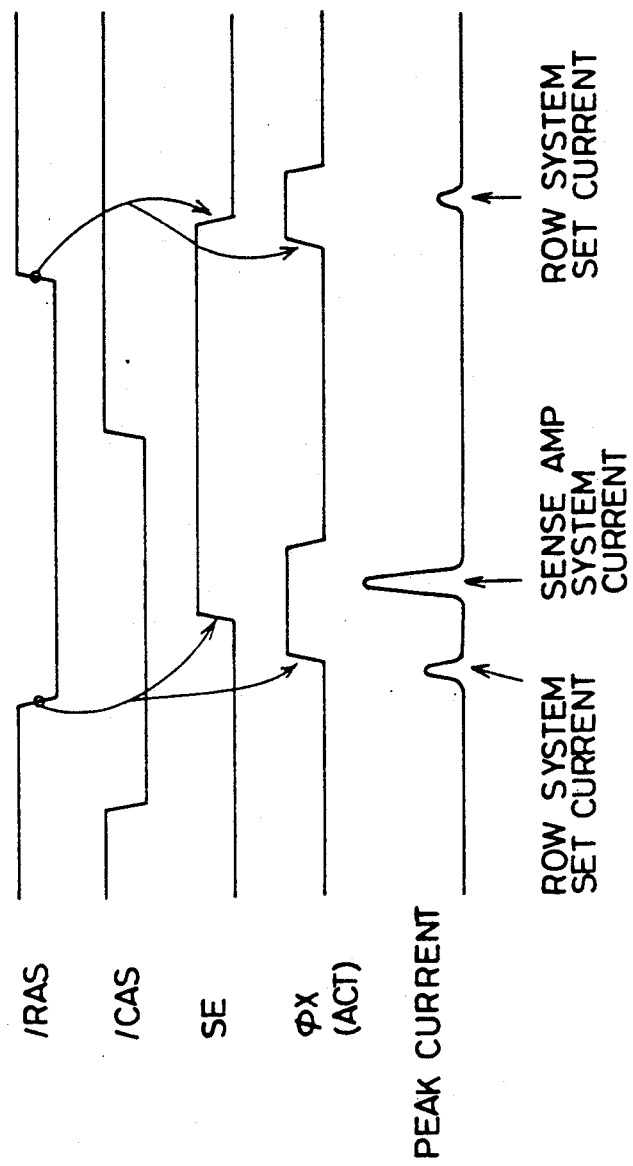
FIG. 8 is a waveform diagram for use in explaining another example of the control operation in the CAS before RAS refresh cycle in the normal mode.

Description will now be given on a control operation of control signal generating circuit 60 with reference to the waveform diagrams of FIGS. 6-8.

An operation in a normal cycle in the normal mode (normal operation) will first be described with reference to FIG. 6. When row address strobe signal/RAS attains a logic low level and an active period is started, control signal $\phi X$ rises to a logic high level. Accordingly, differential amplifying circuit 20 is activated, so that driver circuit 30 applies internal supply voltage IVcc to DRAM 3 and peripheral circuit 4. This makes it possible to compensate for a row system set current, a sense amplifier system current, a column system current and a row system reset current.

If row address strobe signal/RAS attains a logic high level and the active period is terminated, then control signal $\phi X$ falls to a logic low level. Accordingly, differential amplifying circuit 20 is inactivated, so that internal supply voltage IVcc is applied only by n channel driver circuit 40. During a standby period, power consumption of DRAM 3 and peripheral circuit 4 is small, and hence internal supply voltage IVcc can be held constant.

An operation in a CAS before RAS refresh cycle in the normal mode will now be described with reference to FIG. 7. A column system does not operate at the time of CAS before RAS refresh. Thus, even if row address strobe signal/RAS attains a logic low level, the operation of DRAM 3 and peripheral circuit 4 can be terminated at the time the refresh of memory cells is completed. In that case, if DRAM 3 and peripheral circuit 4 are reset at that time, no peak current is generated in DRAM 3 and peripheral circuit 4 even if row address strobe signa/RAS is thereafter in a logic low level.

Accordingly, the inside of the semiconductor device is put in a standby state as in the standby period. Thus, control signal $\phi X$ attains a logic high level only during the period that the operation of DRAM 3 and peripheral circuit 4 is terminated, so that differential amplifier 20 is activated. In the other period than this period, even if row address strobe signal/RAS is at a logic low level, internal supply voltage IVcc is supplied only by n channel driver circuit 40.

Accordingly, even if the period that row address strobe signal/RAS is at a logic low level in the CAS before RAS refresh cycle becomes longer, power consumed in differential amplifying circuit 20 can sufficiently be reduced only if the operation of DRAM 3 and peripheral circuit 4 is completed.

Another example of the operation in the CAS before RAS refresh cycle in the normal mode will now be described with reference to FIG. 8. In the case where DRAM 3 and peripheral circuit 4 are reset not at the time that the refresh is completed but at the time that row address strobe signal/RAS rises to a logic high level, the timing of control signal $\phi X$ is as shown in FIG. 8. Control signal $\phi X$ attains a logic high level only at the time of a refresh operation and at the time of a reset operation, thereby to activate differential amplifying circuit 20. In the period other than that period, internal supply voltage IVcc is supplied only by n channel driver circuit 40. Accordingly, power consumption can substantially be reduced even if the period that row address strobe signal/RAS is at a logic low level is long.

(d) Other Control Operations of Control Signal Generating Circuit 60 (FIGS. 9-12)

Figure 9:
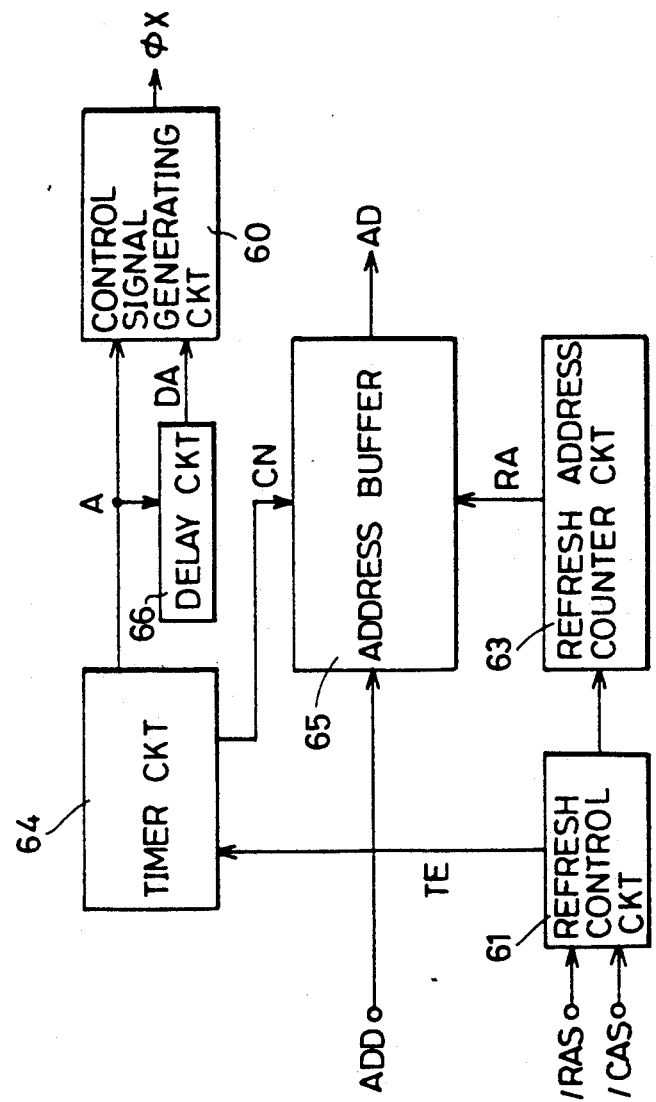
FIG. 9 is a block diagram for use in explaining another control operation of the control signal generating circuit.
Figure 10:
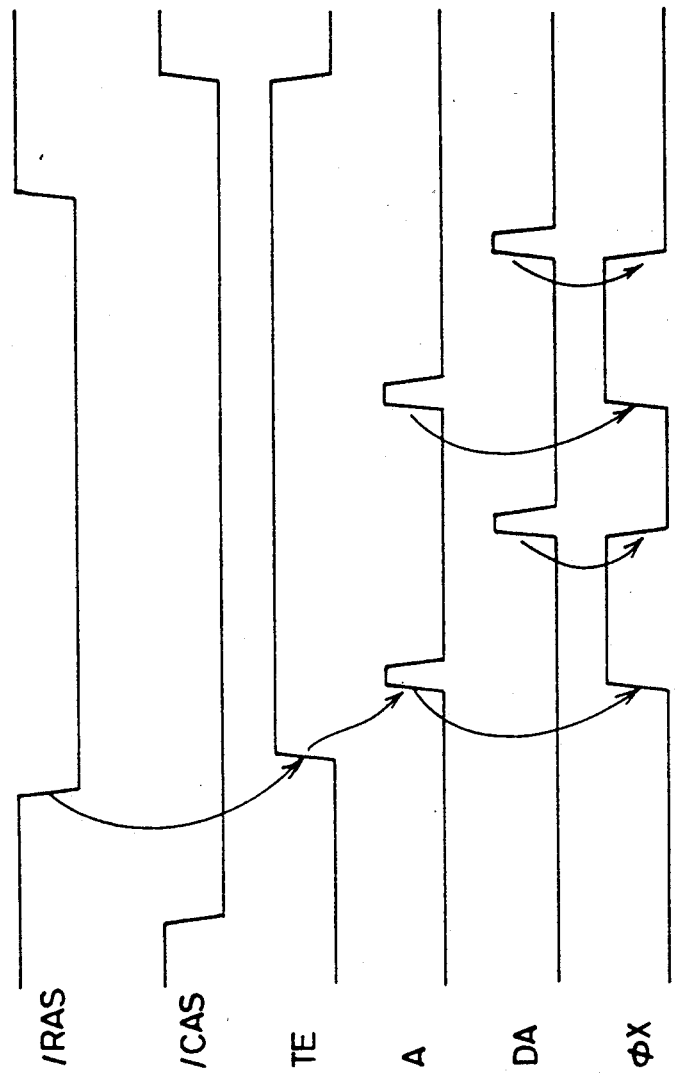
FIG. 10 is a waveform diagram for use in explaining timing of a control signal.

An operation of control signal generating circuit 60 in an auto refresh cycle will now be described with reference to FIGS. 9 and 10. In this case, control signal generating circuit 60 is controlled by a refresh control circuit 61, a timer circuit 64 and a delay circuit 66.

When the auto refresh cycle is started in response to row address strobe signal/RAS and column address strobe signal/CAS, an activating signal is applied from refresh control circuit 61 to a refresh address counter circuit 63, and also an activating signal TE is applied to timer circuit 64. Accordingly, refresh address counter circuit 63 and timer circuit 64 are activated. Consequently, a refresh address signal RA is applied from refresh address counter circuit 63 to an address buffer 65. Address buffer 65 is controlled by a control signal CN output from timer circuit 64. Address buffer 65 responds to refresh address signal RA to apply an address signal AD to a memory array MA (see FIG. 1). This address signal AD designates an address to be refreshed.

Timer circuit 64 applies a trigger signal A to delay circuit 66 and control signal generating circuit 60. Control signal generating circuit 60 responds to the rising of trigger signal A to cause control signal $\phi X$ to attain a logic high level. Delay circuit 66 delays trigger signal A for a definite time period to output a delay signal DA. Control signal generating circuit 60 responds to the rising of delay signal DA to cause control signal $\phi X$ to fall to a logic low level.

Delay time by delay circuit 66 is previously set to a sufficient time for the completion of a restore operation in a memory cell to be refreshed. Differential amplifying circuit 20 shown in FIG. 1 is activated and inactivated by use of this control signal $\phi X$. Consequently, differential amplifying circuit 20 is activated only during the period that the memory cell is refreshed, and hence an unnecessary current does not flow at the time of refresh, so that the current of refresh can be reduced.

In the normal cycle, an externally applied address signal ADD is applied as address signal AD via address buffer 65 to memory array MA (see FIG. 1).

Figure 11:
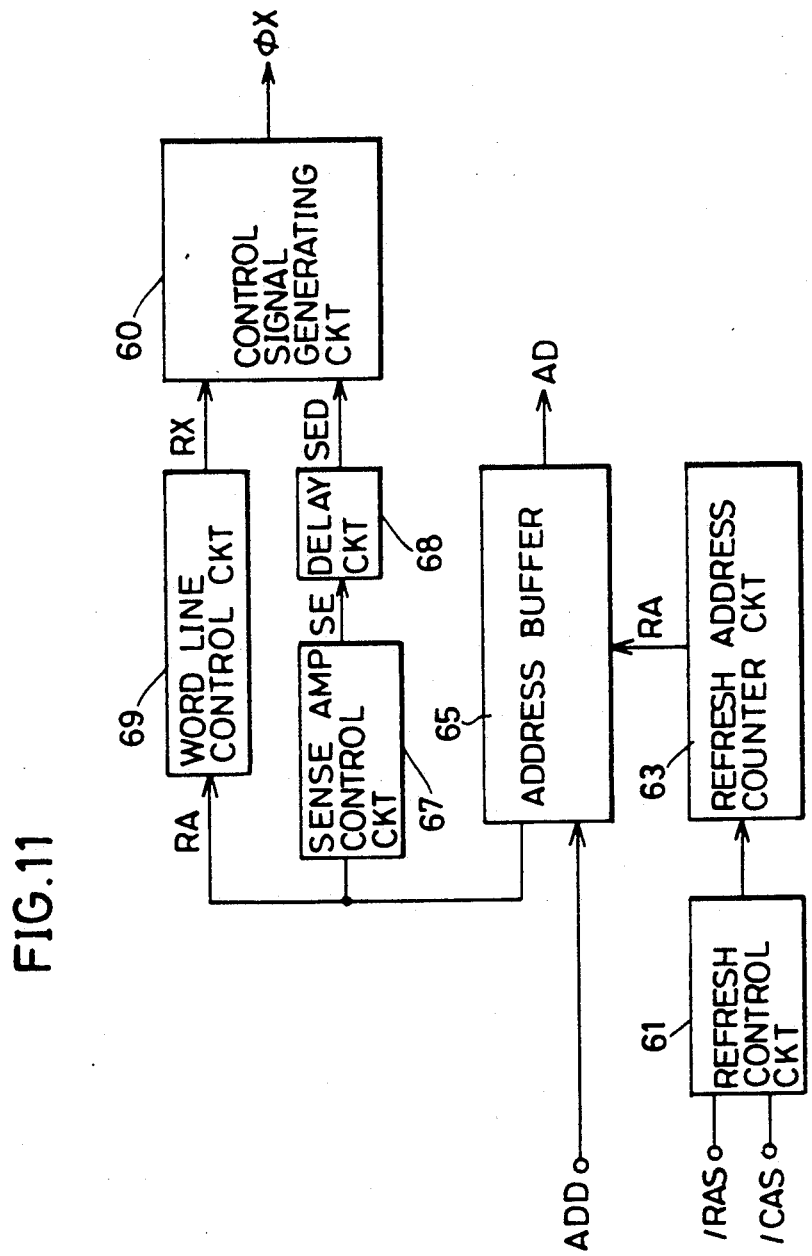
FIG. 11 is a block diagram for use in explaining still another control operation of the control signal generating circuit.
Figure 12:
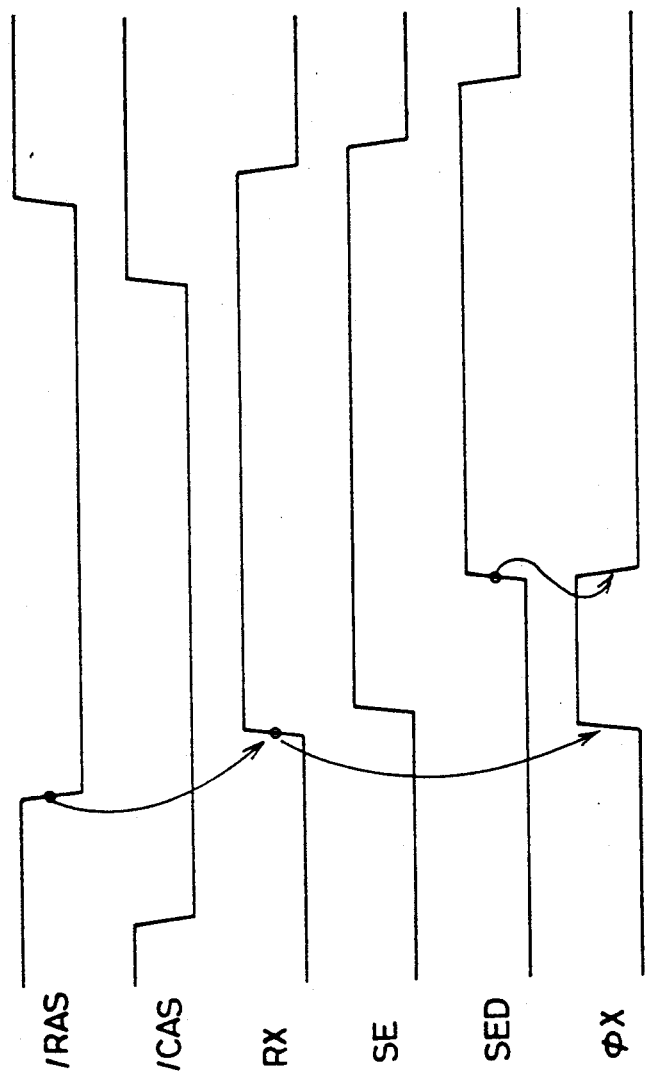
FIG. 12 is a waveform diagram for use in explaining timing of a control signal.

An operation in the CAS before RAS refresh cycle will now be described with reference to FIGS. 11 and 12. In that case, control signal generating circuit 60 is controlled by refresh control circuit 61, refresh address counter circuit 63, address buffer 65, a word line control circuit 69, a sense amplifier control circuit 67 and a delay circuit 68.

When the CAS before RAS refresh cycle is started in response to row address strobe signal/RAS and column address strobe signal/CAS, an activating signal is applied from refresh control circuit 61 to refresh address counter circuit 63. Accordingly, refresh address counter circuit 63 is activated, so that a refresh address signal RA is applied to address buffer 65.

Address buffer 65 responds to this refresh address signal RA to apply address signal AD to memory array MA (see FIG. 1), and also refresh address signal RA is applied to word line control circuit 69 and sense amplifier control circuit 67. Consequently, word line control circuit 69 outputs a word line control signal RX, and sense amplifier control circuit 67 outputs a sense amplifier activating signal SE. Delay circuit 68 delays sense amplifier activating signal SE for a definite time period to output a delay signal SED.

Control signal generating circuit 60 responds to the rising of word line control signal RX to cause control signal $\phi X$ to attain a logic high level, while it responds to the rising of delay signal SED to cause control signal $\phi X$ to attain a logic low level. Delay time by delay circuit 68 is set to a sufficient time for completion of a restore operation of the memory cell to be refreshed. Differential amplifying circuit 20 is activated and inactivated by use of this control signal $\phi X$.

As described above, since differential amplifying circuit 20 is activated only during the period that the memory cell is refreshed, an unnecessary current does not flow at the time of refresh, so that the current in refresh can be reduced.

Figure 35:
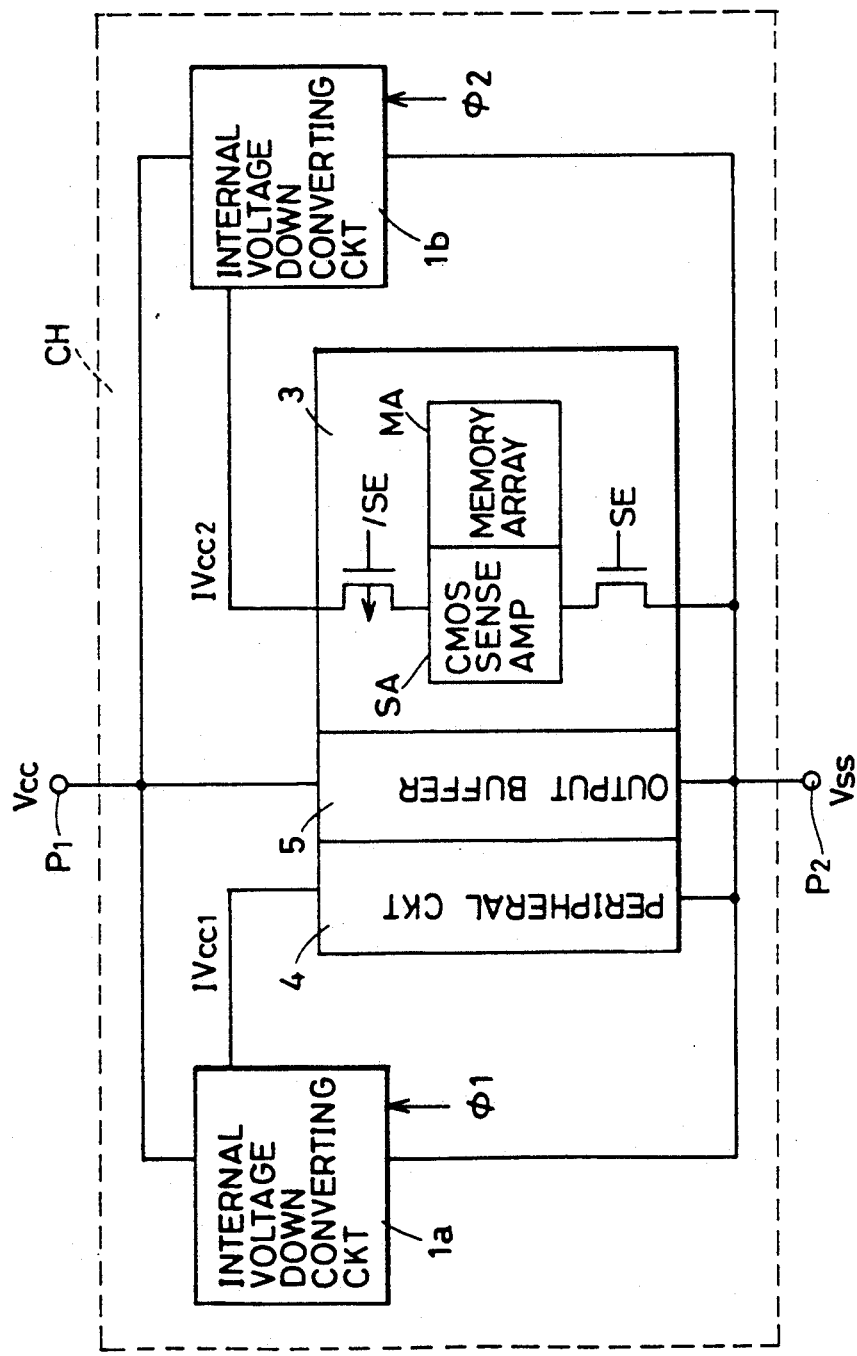
FIG. 35 is a block diagram showing structure of a conventional MOS-DRAM incorporating an internal voltage down converting circuit.
Figure 36:
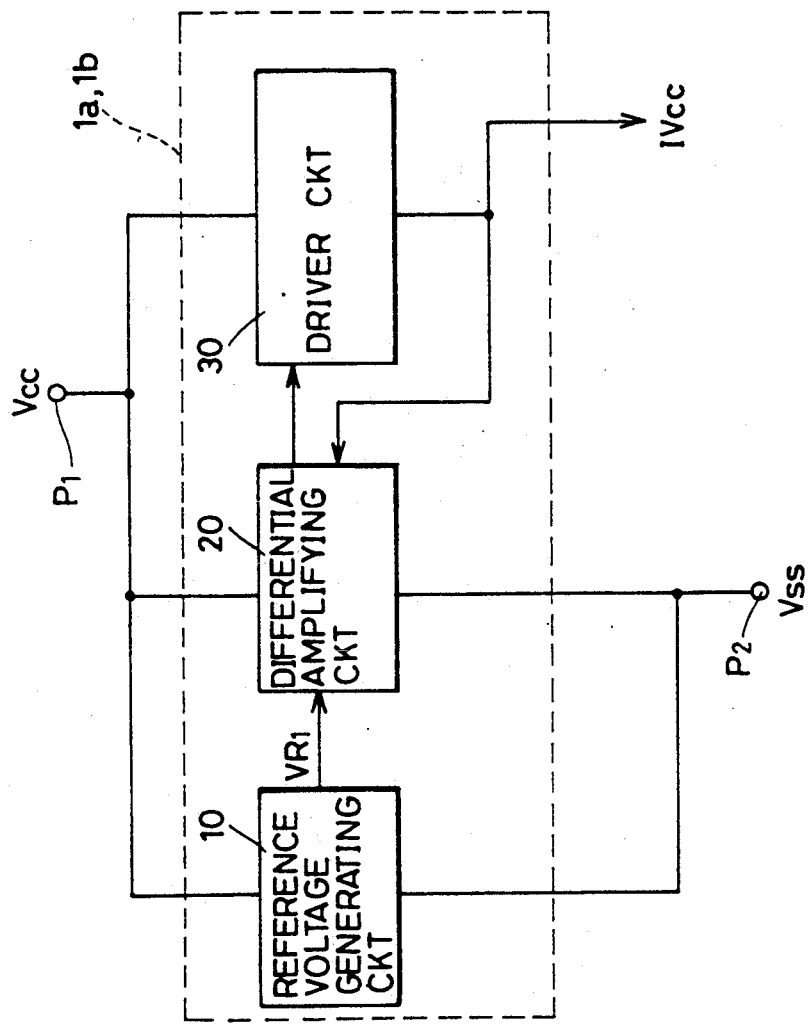
FIG. 36 is a block diagram showing one example of configuration of the internal voltage down converting circuit.

The control operation of FIGS. 9–12 is also applicable to internal voltage down converting circuit 1b shown in FIG. 35. In that case also, the current in refresh can be reduced.

Figure 13:
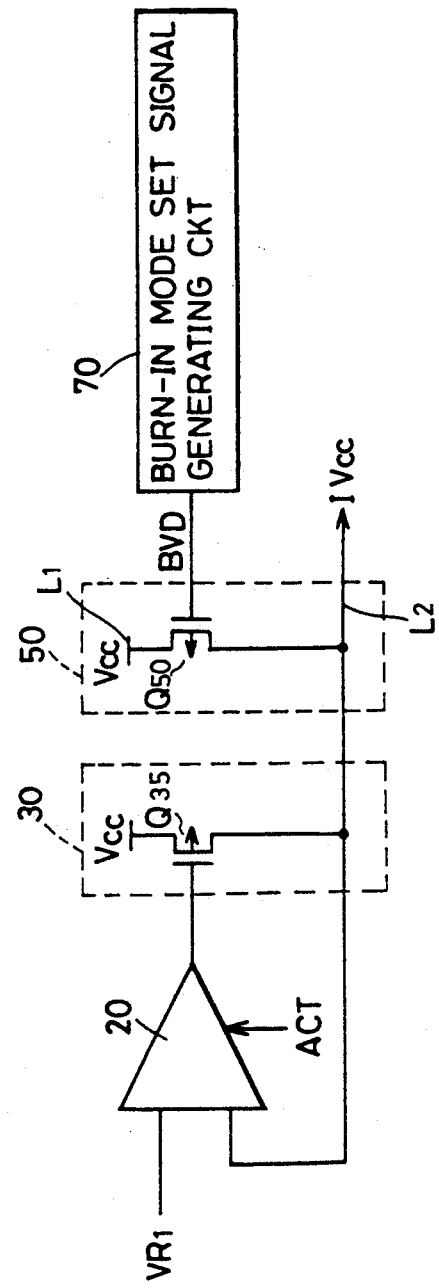
FIG. 13 is a circuit diagram showing configuration of a burn-in mode setting circuit.
Figure 14:
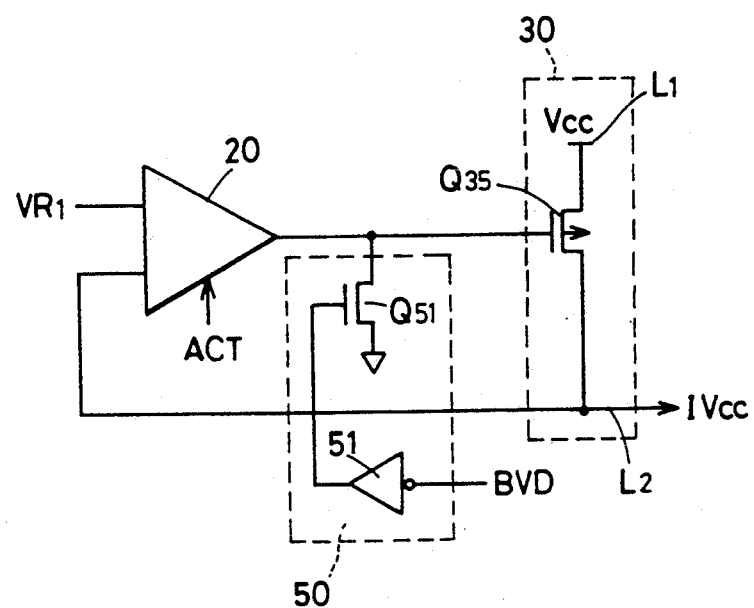
FIG. 14 is a circuit diagram showing another example of the burn-in mode setting circuit.
Figure 15:
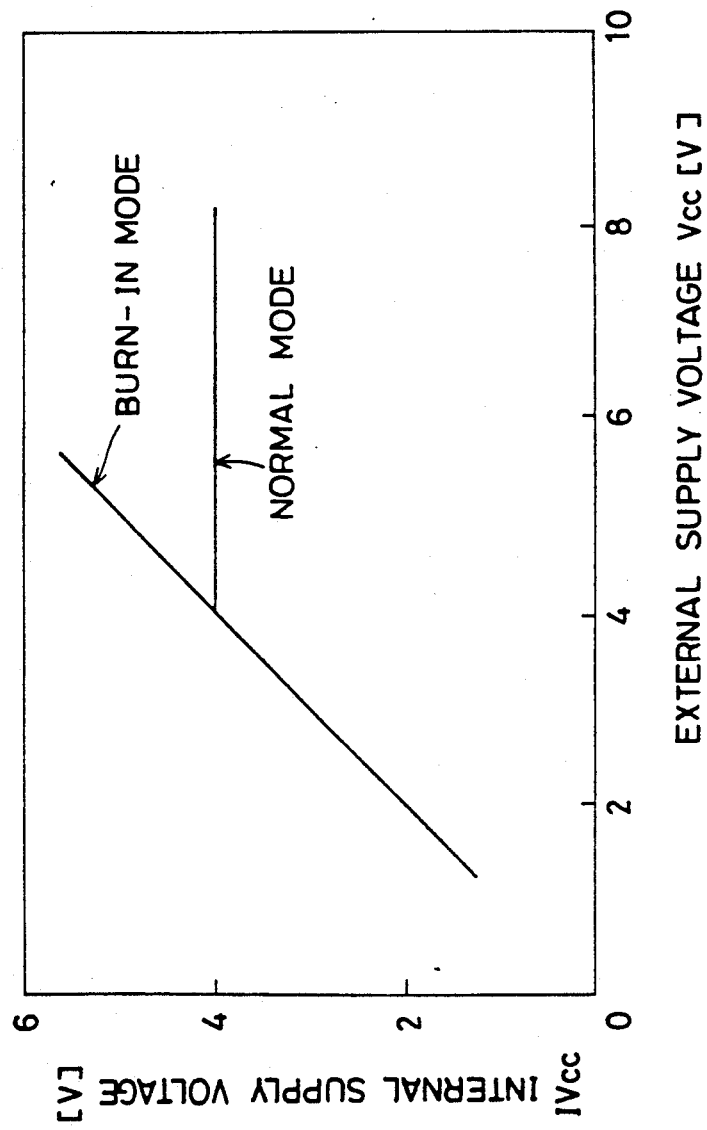
FIG. 15 is a diagram showing characteristics of an internal power supply voltage.

(e) The Details of Burn-In Mode Setting Circuit 50 (FIGS. 13–15)

FIG. 13 shows a detailed configuration of burn-in mode setting circuit 50. Burn-in mode setting circuit 50 includes a P channel MOS transistor Q50. Transistor Q50 is connected in parallel to transistor Q35 of driver circuit 30. Transistor Q50 has its gate supplied with a burn-in mode set signal BVD.

In the normal mode, burn-in mode set signal BVD attains a logic high level. This turns transistor Q50 off. At that time, control signal $\phi X$ is applied as activating signal ACT to differential amplifying circuit 20. Accordingly, internal supply voltage IVcc is supplied by driver circuit 30.

In the burn-in mode test, burn-in mode set signal BVD attains a logic low level. This turns transistor Q50 on. Accordingly, external supply voltage Vcc is directly applied to internal power supply line L2. As a result, Vcc=IVcc is satisfied. At this time, activating signal ACT attains a logic low level. Accordingly, differential amplifying circuit 20 is inactivated, so that the output of differential amplifying circuit 20 attains a logic high level. This turns transistor Q35 off.

FIG. 14 shows another example of burn-in mode setting circuit 50. Burn-in mode setting circuit 50 includes an N channel MOS transistor Q51 and an invertor 51. Transistor Q51 is connected between a gate of transistor Q35 of driver circuit 30 and a ground terminal. Transistor Q51 has its gate supplied with burn-in mode set signal BVD via invertor 51.

In the normal mode, burn-in mode set signal BVD attains a logic high level, so that transistor Q51 is turned off. Accordingly, differential amplifying circuit 20 and driver circuit 30 constitute a feedback loop, and internal supply voltage IVcc is supplied.

In the burn-in mode, burn-in mode set signal BVD attains a logic low level, so that transistor Q51 is turned on. Accordingly, transistor Q35 of driver circuit 30 is turned on, so that external supply voltage Vcc is directly applied to internal power supply line L2.

FIG. 15 shows a characteristic of internal supply voltage IVcc. In the burn-in mode, external supply voltage Vcc is equal to internal supply voltage IVcc, and hence overvoltage is not unnecessarily applied to each of the circuit elements. Since a precise voltage can be applied to each circuit element independently of variation in process parameter, a highly accurate and highly reproducible burn-in test can be carried out.

Burn-in mode setting circuit 50 is also applicable to the semiconductor device shown in FIG. 35. In that case also, a highly accurate and highly reproducible burn-in test can be carried out.

(f) The Details of Burn-In Mode Set Signal Generating Circuit 70 (FIGS. 16–21)

Figure 16:
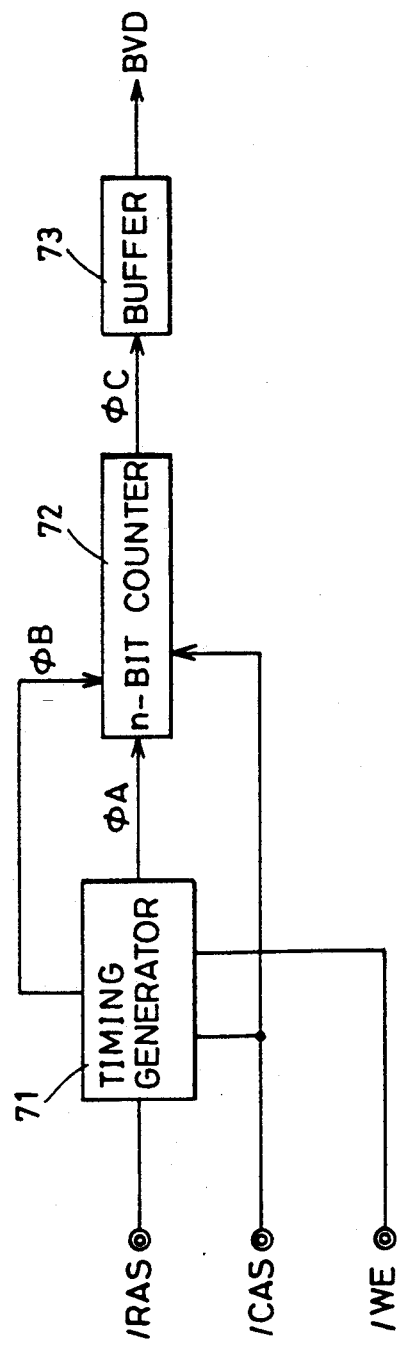
FIG. 16 is a block diagram showing one example of configuration of a burn-in mode set signal generating circuit.
Figure 17:
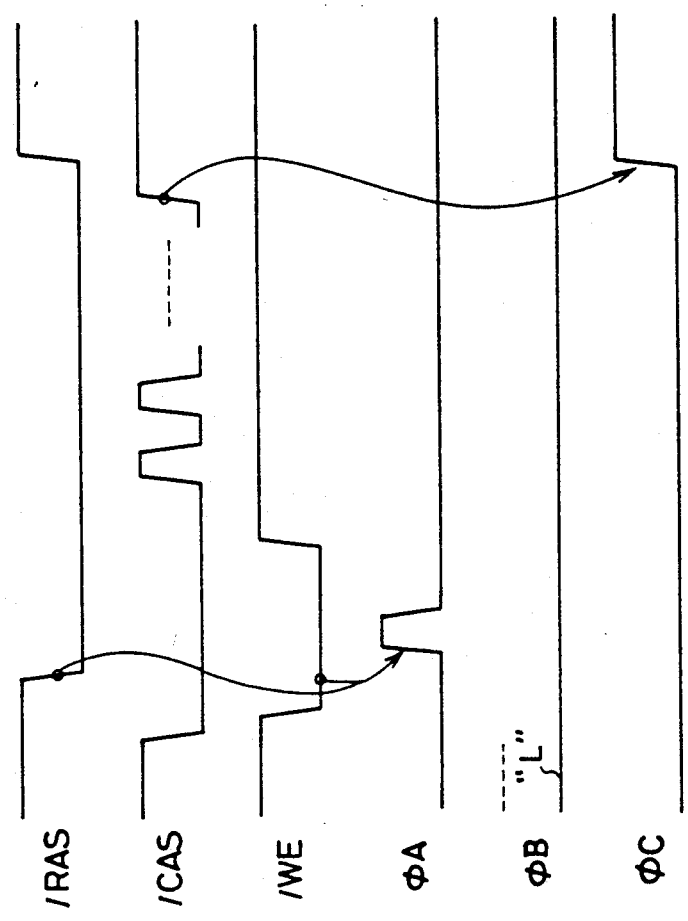
FIG. 17 is a waveform diagram for use in explaining a burn-in mode set cycle.
Figure 18:
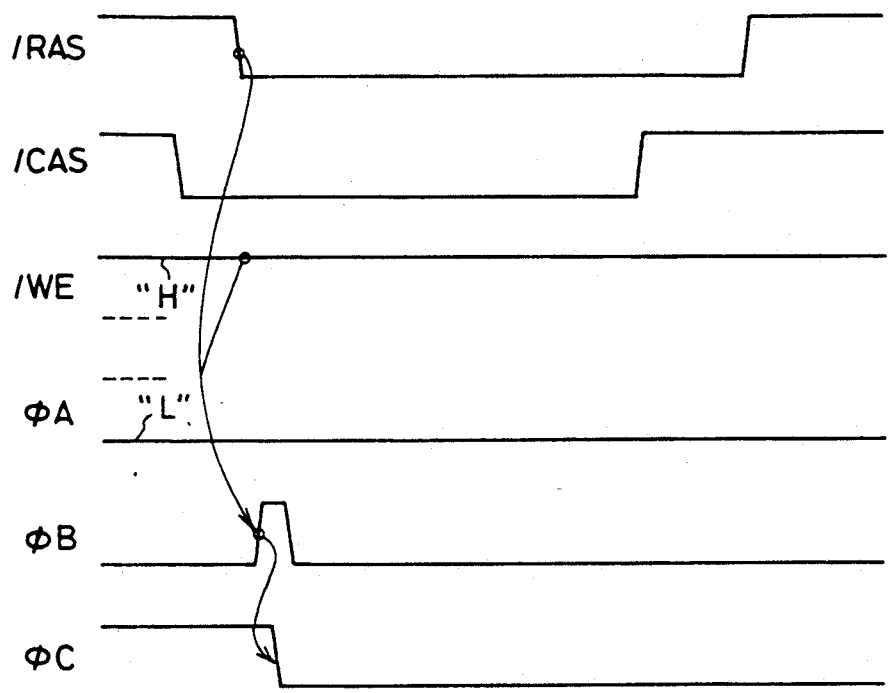
FIG. 18 is a waveform diagram for use in explaining a burn-in mode reset cycle.

FIG. 16 shows one example of burn-in mode set signal generating circuit 70, and FIGS. 17 and 18 show signal waveform diagrams of a burn-in mode set cycle and a burn-in mode reset cycle, respectively.

The burn-in mode set cycle will first be described. A timing generator 71 generates a counter reset pulse $\phi A$ if a column address strobe signal/CAS and a write enable signal/WE are at a logic low level at the time that a row address strobe signal/RAS falls. This causes an n-bit counter 72 to start counting.

Column address strobe signal/CAS is applied as an input of n-bit counter 72. If an operation of changing the logic level of column address strobe signal/CAS to a logic high level and a logic low level is repeated by $2^n$ times, a counter signal $\phi C$ output from n-bit counter 72 rises to a logic high level. A burn-in mode set signal BVD output from a buffer 73 falls to a logic low level in response to the rising of counter signal $\phi C$.

The burn-in mode reset cycle will then be described. Timing generator 71 generates a counter reset pulse $\phi B$ if column address strobe signal/CAS and write enable signal/WE are at a logic low level and a logic high level, respectively at the time that row address strobe signal/RAS falls. Accordingly, n-bit counter 72 is reset, so that counter signal $\phi C$ falls to a logic low level. Burn-in mode set signal BVD output from buffer 73 rises to a logic high level in response to the falling of counter signal $\phi C$.

As described above, in the foregoing example, the burn-in mode is set by toggling of external column address strobe signal/CAS on the basis of a WCBR (WE-CAS before RAS) test mode set cycle standardized by JEDEC in a 4M-bit DRAM. The burn-in mode is reset by a CBR (CAS before RAS) cycle or ROR (RAS only refresh) cycle.

Since the setting of the burn-in mode is available by a timing method in the foregoing example, a burn-in apparatus does not require a plurality of power supplies in the burn-in test. Accordingly, the setting of the burn-in mode can be carried out at a lower cost. Timing for setting the burn-in mode is not limited to the above-described timing, however, it is necessary to select timing that is distinguishable over timing which is not normally described in product specifications, i.e., timing of a normal cycle.

Figure 19:
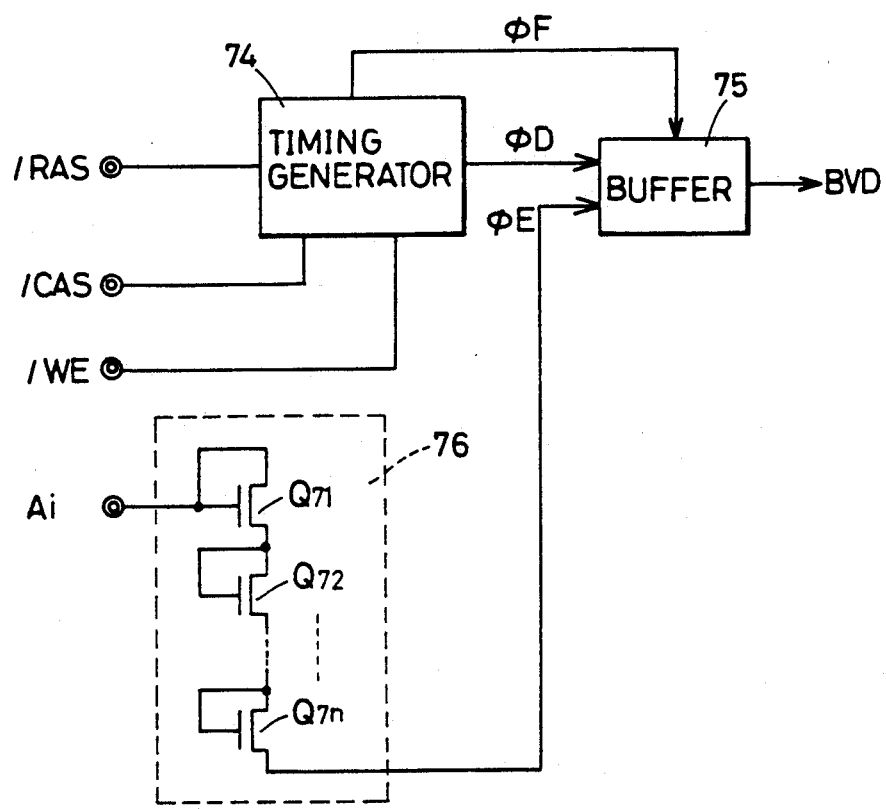
FIG. 19 is a block diagram showing another example of the configuration of the burn-in mode set signal generating circuit.
Figure 20:
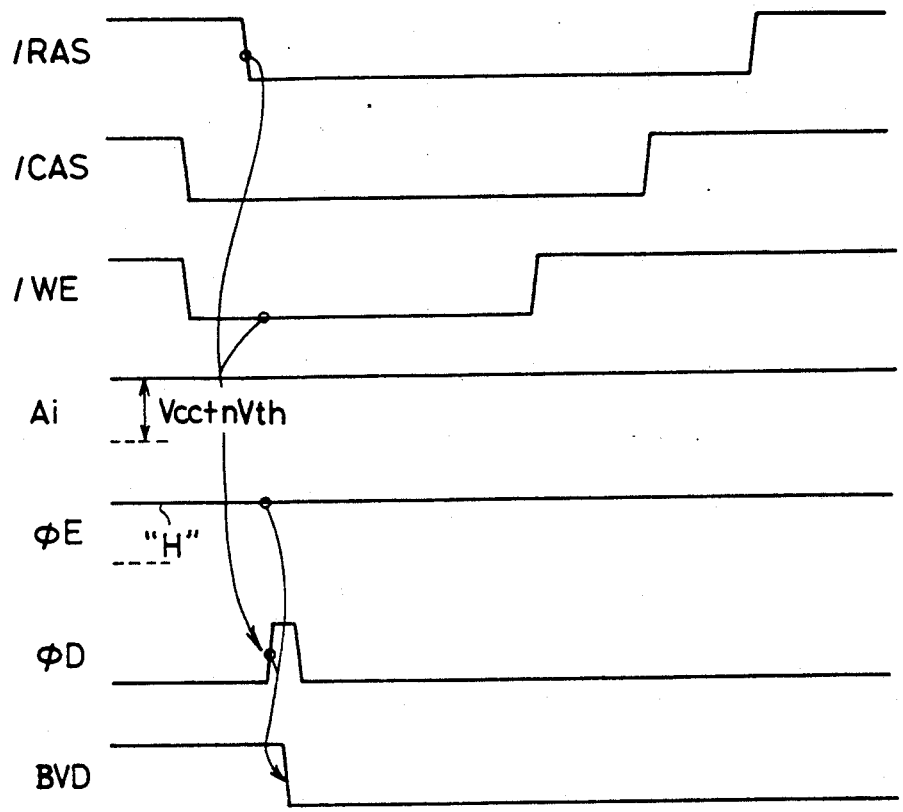
FIG. 20 is a waveform diagram for use in explaining a burn-in mode set cycle.
Figure 21:
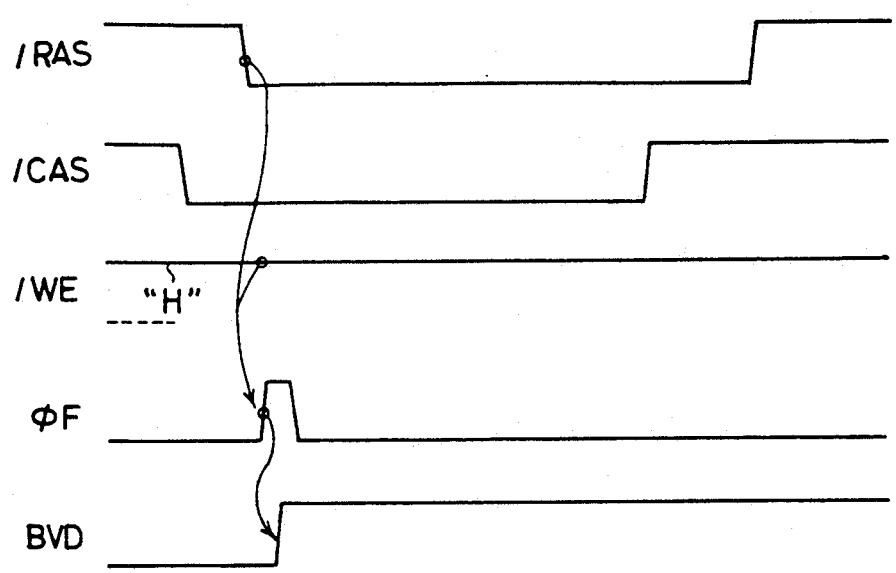
FIG. 21 is a waveform diagram for use in explaining a burn-in mode reset cycle.

FIG. 19 shows another example of burn-in mode set signal generating circuit 70, and FIGS. 20 and 21 show signal waveform diagrams of a burn-in mode set cycle and a burn-in mode reset cycle, respectively.

The burn-in mode set cycle will first be described. A high voltage detecting circuit 76 includes N channel MOS transistors Q71–Q7n in n stages that are connected in cascade to an arbitrary address terminal. A timing generator 74 generates a clock pulse $\phi D$ if a column address strobe signal/CAS and a write enable signal/WE are at a logic low level at the time that a row address strobe signal/RAS falls. At that time, if a high voltage (Vcc+ n·Vth) is applied to the address terminal, then a signal $\phi E$ is at a logic high level. If signal $\phi E$ is at a logic high level at the time that clock pulse $\phi D$ rises, then a buffer 75 causes a burn-in mode set signal BVD to fall to a logic low level.

The burn-in mode reset cycle will then be described. If column address strobe signal/CAS and write enable signal/WE are at a logic low level and a logic high level, respectively at the time that row address strobe signal/RAS falls, then timing generator 74 generates a clock pulse $\phi F$. Buffer 75 responds to the rising of clock pulse $\phi F$ to raise burn-in mode set signal BVD to a logic high level.

In the foregoing example, the burn-in mode set signal is generated in the combination of the WCBR test mode set cycle and the application of a high voltage set to be higher than an external supply voltage Vcc in product specifications to one or a plurality of address terminals.

In other cycles than the burn-in mode set cycle, the corresponding address terminal(s) is/are supplied with a normal voltage of a high level or a low level as a logic high level or a logic low level, not a high voltage. A high voltage may be applied as a logic high level in place of the normal high level voltage.

Further, a high level voltage to be applied to, e.g., a data input terminal in place of the address terminal may be set to the above-described high voltage in the burn-in mode set cycle.

(2) A Second Embodiment (FIGS. 22–25)

Figure 22:
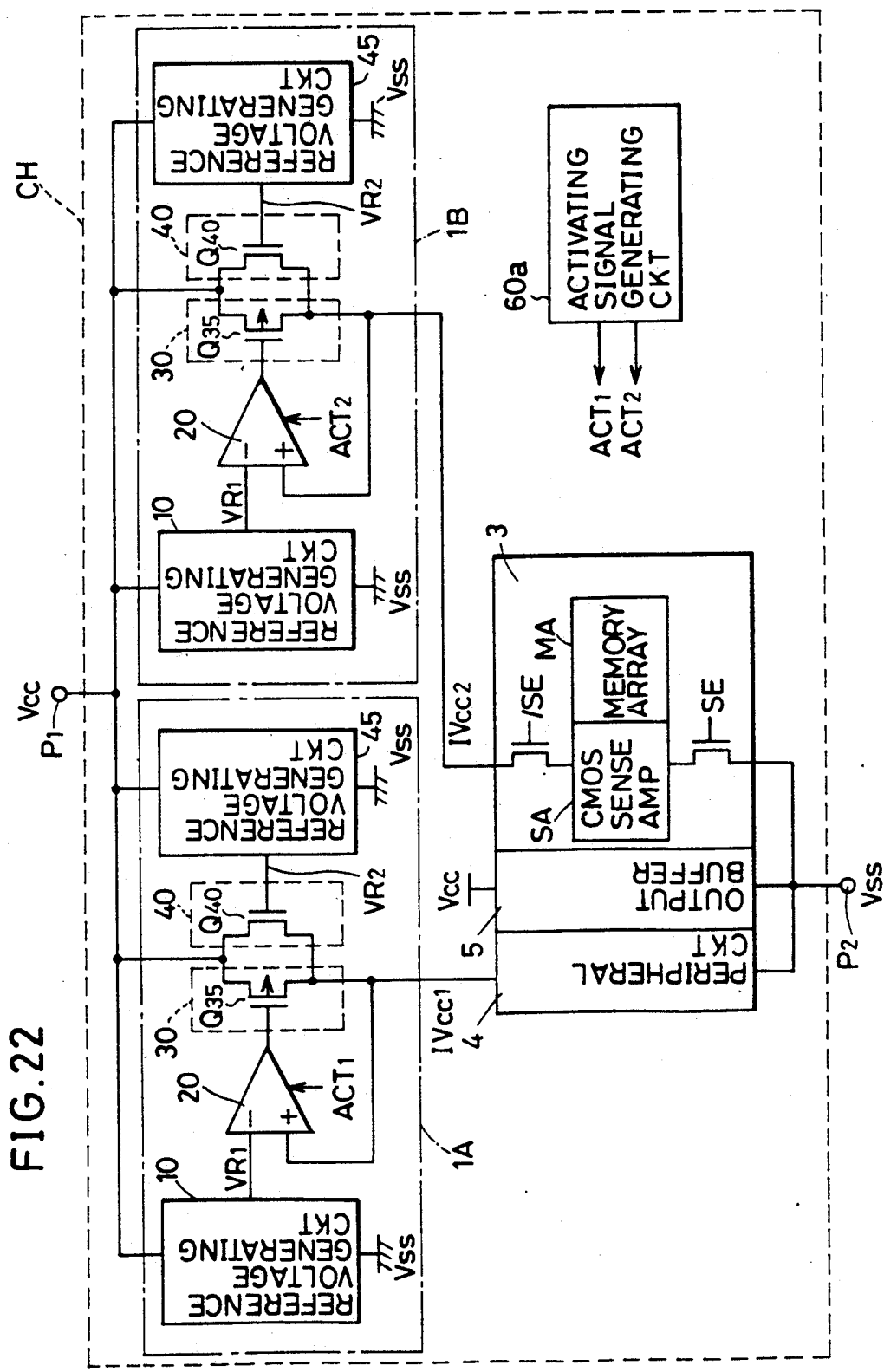
FIG. 22 is a block diagram showing structure of a semiconductor device according to a second embodiment of the present invention.

(a) Overall Structure and Schematic Operation (FIG. 22)

FIG. 22 is a block diagram showing structure of a semiconductor device according to the second embodiment. This semiconductor device CH includes two internal voltage down converting circuits 1A and 1B. Internal voltage down converting circuit 1A downconverts an external supply voltage Vcc to an internal supply voltage IVcc 1 and applies the down-converted voltage to a peripheral circuit 4. Internal voltage down converting circuit 1B downconverts external supply voltage Vcc to an internal supply voltage IVcc 2 and applies the down-converted voltage to a DRAM 3. An activating signal generating circuit 60a generates two activating signals ACT 1 and ACT 2. A differential amplifying circuit 20 in internal voltage down converting circuit 1A is controlled by activating signal ACT 1, and a differential amplifying circuit 20 in internal voltage down converting circuit 1B is controlled by activating signal ACT 2.

Figure 23:
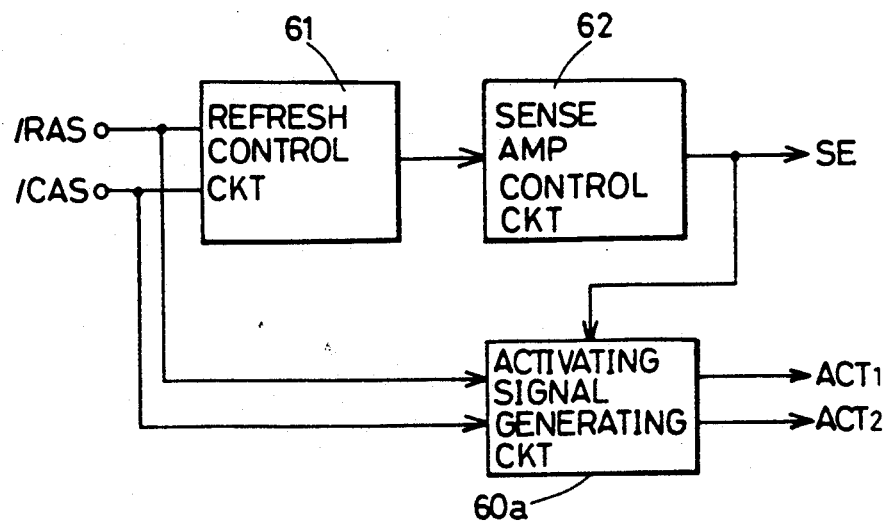
FIG. 23 is a block diagram for use in explaining an operation of an activating signal generating circuit.

As shown in FIG. 23, activating signal generating circuit 60a generates activating signals ACT 1 and ACT 2 in response to a row address strobe signal/RAS, a column address strobe signal/CAS and a sense amplifier activating signal SE.

Figure 24:
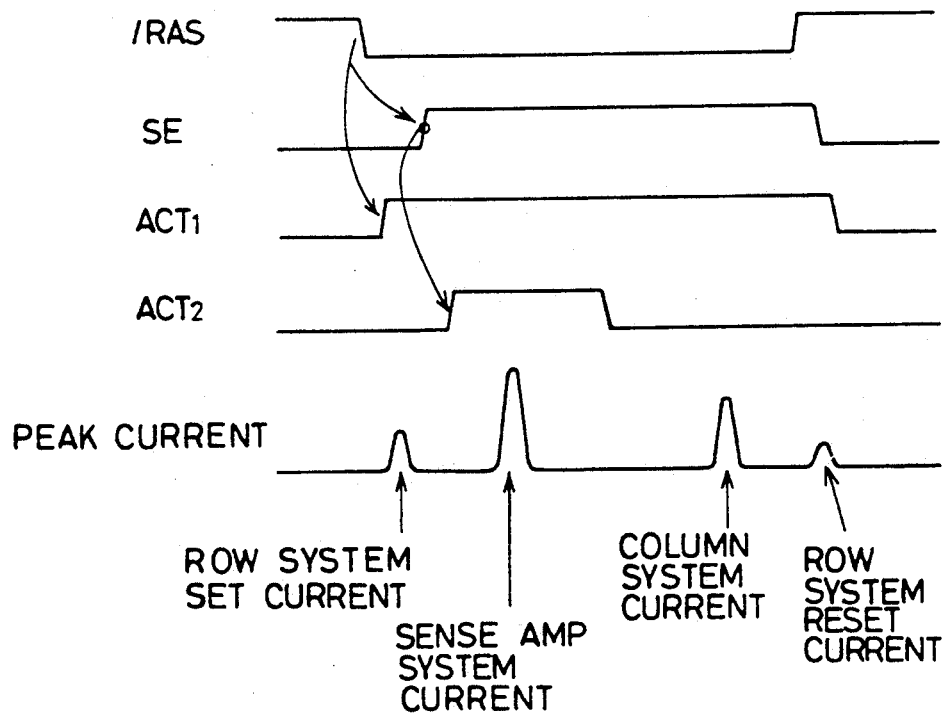
FIG. 24 is a waveform diagram for use in explaining timing of an activating signal in a normal cycle in a normal mode.

Description will now be given on an operation in a normal cycle in a normal mode with reference to FIG. 24. Activating signal ACT 1 rises to a logic high level in response to the falling of row address strobe signal/RAS. Accordingly, differential amplifying circuit 20 in internal voltage down converting circuit 1A is activated. Sense amplifier activating signal SE thereafter rises to a logic high level. In response to the rising of sense amplifier activating signal SE, activating signal ACT 2 rises to a logic high level. Accordingly, differential amplifying circuit 20 in internal voltage down converting circuit 1B is activated.

Activating signal ACT 2 falls to a logic low level after an elapse of a definite time period. Accordingly, differential amplifying circuit 20 in internal voltage down converting circuit 1B is inactivated. The time period that activating signal ACT 2 is at a logic high level is preset to the time period required for compensating for a sense amplifier system current.

If row address strobe signal/RAS rises to a logic high level, activating signal ACT 1 falls to a logic low level. Accordingly, differential amplifying circuit 20 in internal voltage down converting circuit 1A is inactivated.

Figure 25:
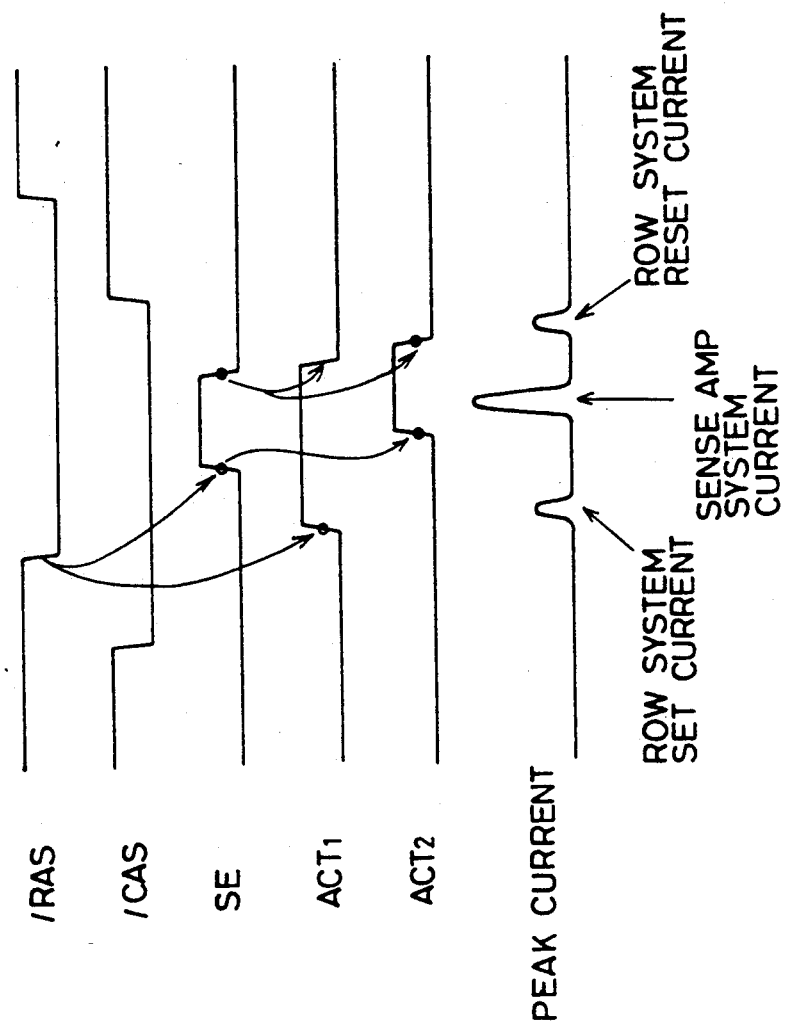
FIG. 25 is a waveform diagram for use in explaining timing of an activating signal in a CAS before RAS refresh cycle in a normal mode.

Description will now be given on an operation in a CAS before RAS refresh cycle in a normal mode with reference to FIG. 25. Activating signal ACT 1 rises to a logic high level in response to the falling of row address strobe signal/RAS. Accordingly, differential amplifying circuit 20 in internal voltage down converting circuit 1A is activated. Sense amplifier activating signal SE then rises to a logic high level. In response to the rising of sense amplifier activating signal SE, activating signal ACT 2 rises to a logic high level. Accordingly, differential amplifying circuit 20 in internal voltage down converting circuit 1B is activated.

Then, sense amplifier activating signal SE falls to a logic low level. In response to the falling of signal SE, activating signal ACT 1 falls to a logic low level, and activating signal ACT 2 falls to a logic low level. Accordingly, differential amplifying circuit 20 in internal voltage down converting circuit 1A is inactivated, and that in internal voltage down converting circuit 1B is inactivated.

Thus, power consumption can be reduced in the CAS before RAS refresh cycle.

Figure 26:
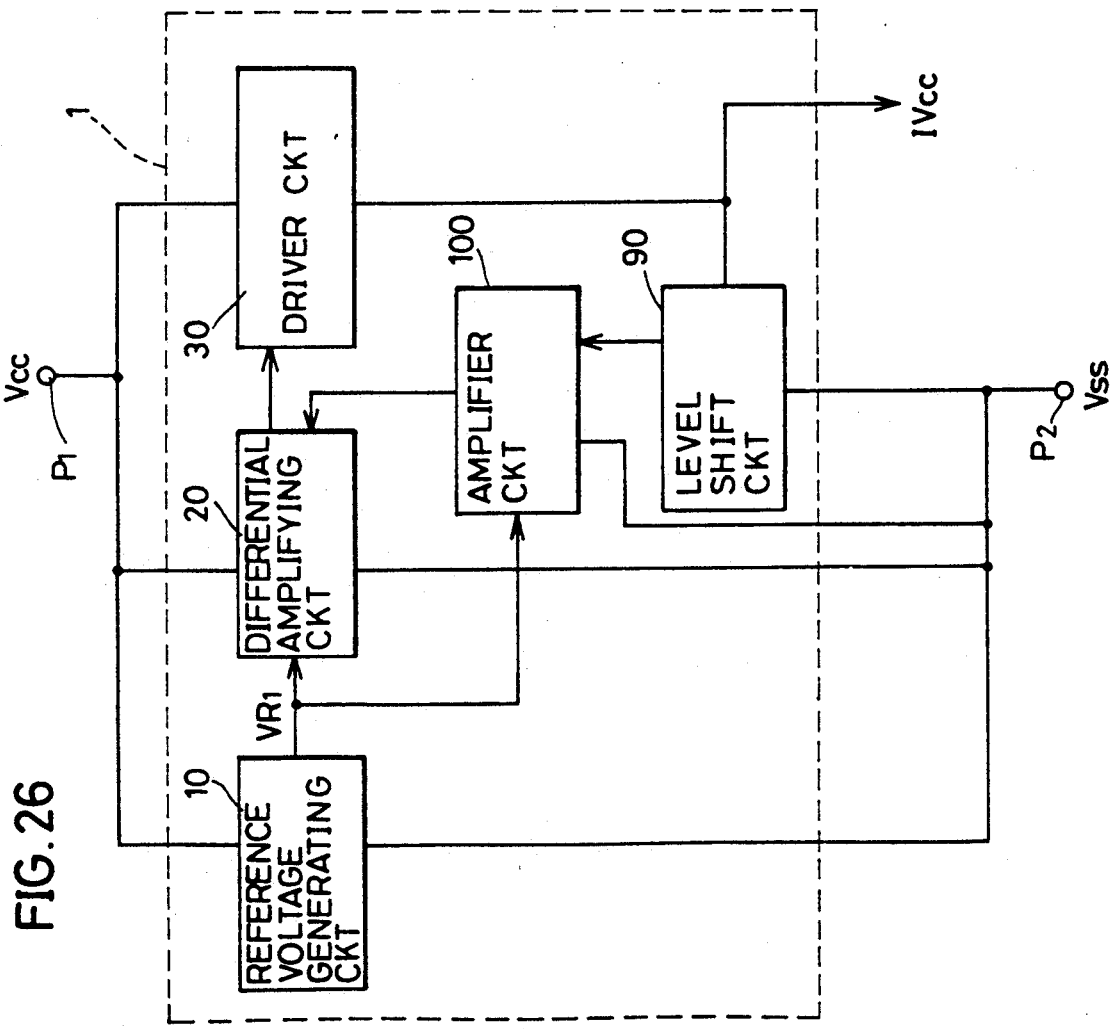
FIG. 26 is a block diagram showing another example of an internal voltage down converting circuit.
Figure 27:
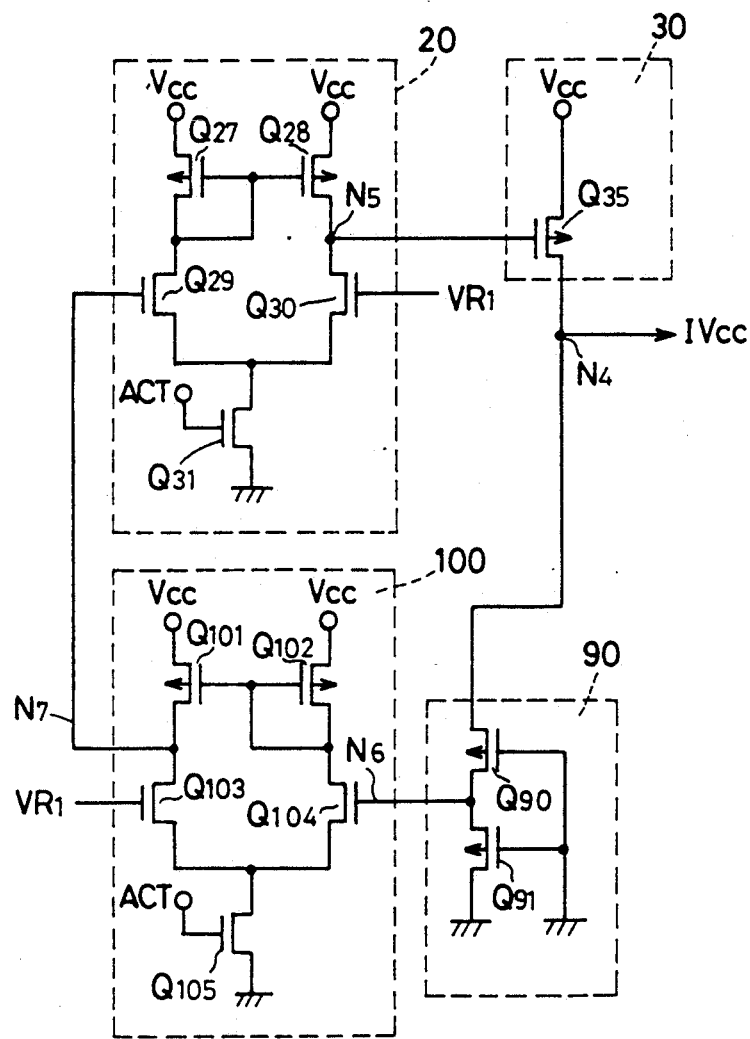
FIG. 27 is a circuit diagram showing a detailed configuration of a part of the internal voltage down converting circuit of FIG. 26.

(3) Another Example of Internal Voltage Down Converting Circuit 1 (FIGS. 26 and 27)

FIG. 26 is a block diagram showing another example of internal voltage down converting circuit 1. An amplifying circuit 100 for amplifying an output amplitude of a level shift circuit 90 is further provided in internal voltage down converting circuit 1. An output of amplifying circuit 100 is applied to a differential amplifying circuit 20. Amplifying circuit 100 is controlled by a reference voltage VR1.

Figure 40:
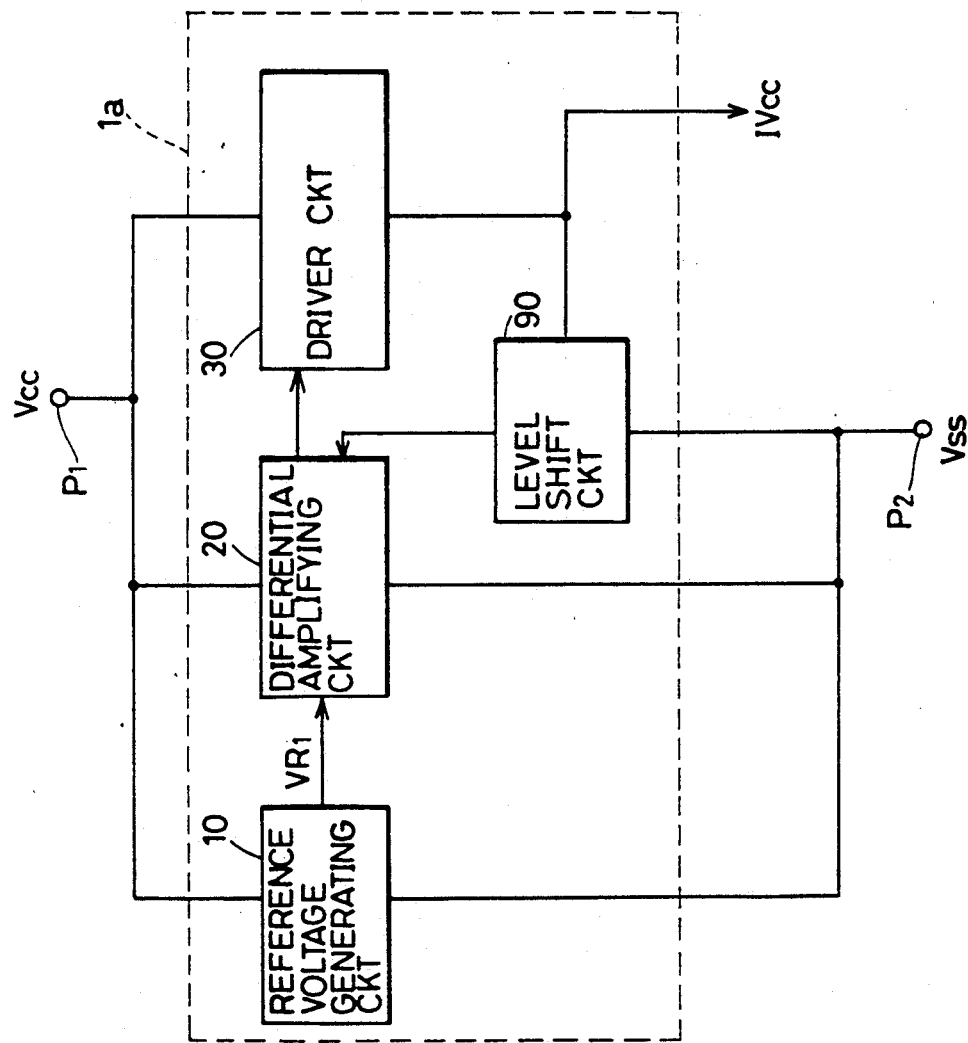
FIG. 40 is a block diagram showing another example of the internal voltage down converting circuit.

FIG. 27 shows a detailed configuration of part of internal voltage down converting circuit 1 of FIG. 26. The configuration of differential amplifying circuit 20, a driver circuit 30 and level shift circuit 90 is identical to that shown in FIG. 40. An activating signal ACT is, however, applied to a gate of a transistor Q31 in differential amplifying circuit 20. Amplifying circuit 100 is a current mirror circuit comprised of P channel MOS transistors Q101 and Q102 and N channel MOS transistors Q103 and Q104. Transistor Q103 has its gate supplied with reference voltage VR1, and transistor Q104 has its gate connected to a node N6 of level shift circuit 90. An N channel MOS transistor Q105 has its gate supplied with activating signal ACT.

An operation of the circuit of FIG. 27 will now be described. When an internal supply voltage IVcc is lower than or equal to 4V, an output of level shift circuit 90 is lower than or equal to 2.4V that is lower than reference voltage VR1. Accordingly, an output of a node N7 of amplifying circuit 100 attains a logic low level of approximately 1 to 2V.

When internal supply voltage IVcc is higher than or equal to 4V, the output of level shift circuit 90 is higher than or equal to 2.4V that is higher than reference voltage VR1. Accordingly, the output of node N7 of amplifying circuit 100 attains a logic high level of approximately 4 to 5V. Since the amplitude of an output voltage of level shift circuit 90 is amplified by amplifying circuit 100, the sensitivity of the internal voltage down converting circuit improves.

This internal voltage down converting circuit is applicable to a semiconductor device shown in FIG. 35 as well as the one shown in FIG. 1.

(4) A Monitor Method of Internal Power Supply Line L2 (FIGS. 28–34)

Figure 28:
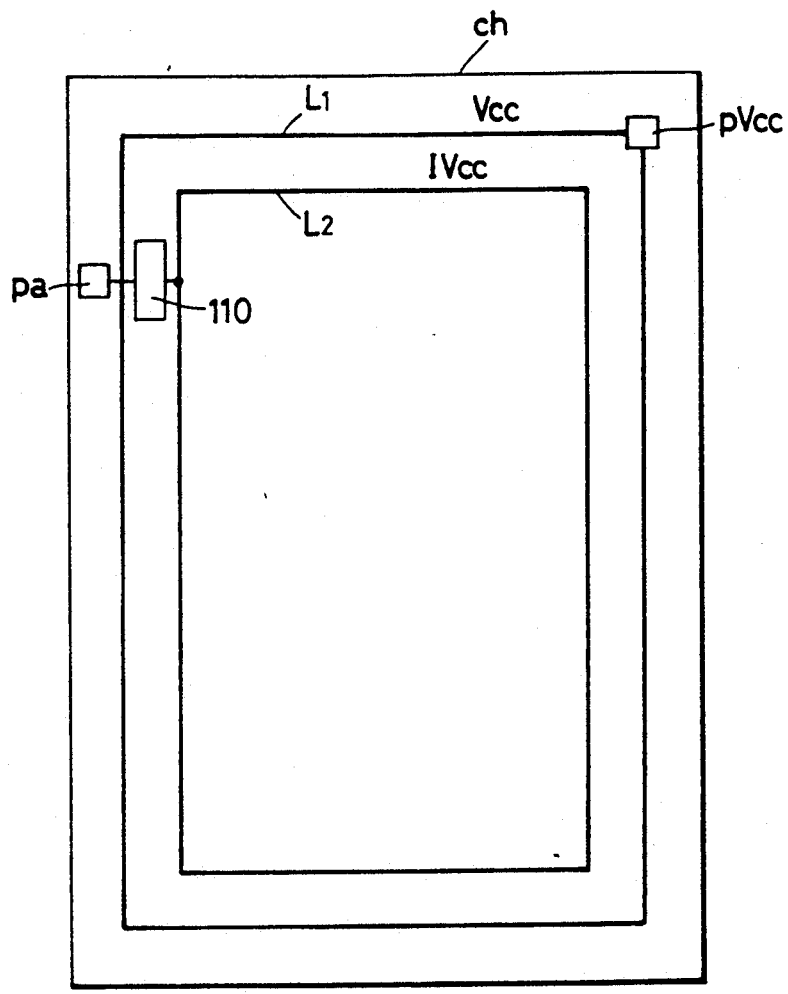
FIG. 28 is a schematic diagram showing a structure on a chip of a semiconductor device including an internal power supply line.

FIG. 28 is a schematic diagram showing structure on a chip ch of a semiconductor device including an external power supply line L1 for receiving an external supply voltage Vcc and an internal power supply line L2 for receiving an internal supply voltage IVcc. As shown in FIG. 28, external power supply line L1 is connected to a power supply pad pVcc. A monitor circuit 110 is connected between an arbitrary pad pa for receiving a signal or a predetermined potential and internal power supply line L2. Pad pa is connected to an external pin.

Figure 29:
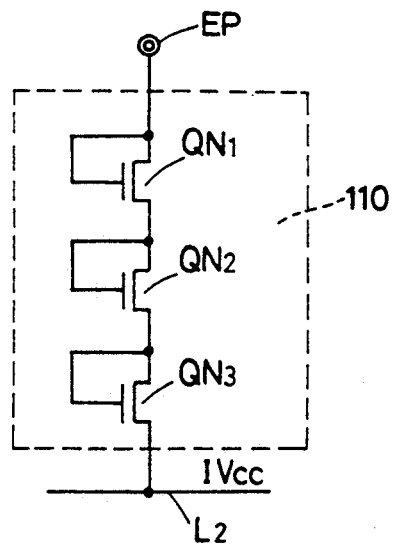
FIG. 29 is a circuit diagram showing a first example of a monitor circuit.

(a) A First Monitor Method (FIG. 29)

Monitor circuit 110 includes N channel MOS transistors QN1–QN3. Transistors QN1–QN3 are connected in series between an external pin EP and internal power supply line L2. Assume that a threshold voltage of transistors QN1–QN3 is Vth.

First, a standby current that flows between a power supply pin for receiving external supply voltage Vcc and a ground pin for receiving a ground potential is measured. Then, the potential of external pin EP is gradually increased while the current flowing across the power supply pin and the ground pin is being monitored. A potential VINT of internal power supply line L2 is calculated in the following expression wherein the potential of external pin EP provided when the current flowing across the power supply pin and the ground pin starts increasing is VEXT.

$$VINT = VEXT - 3 \cdot Vth$$

This makes it possible to monitor the potential of internal power supply line L2 without directly probing internal power supply line L2.

Figure 30:
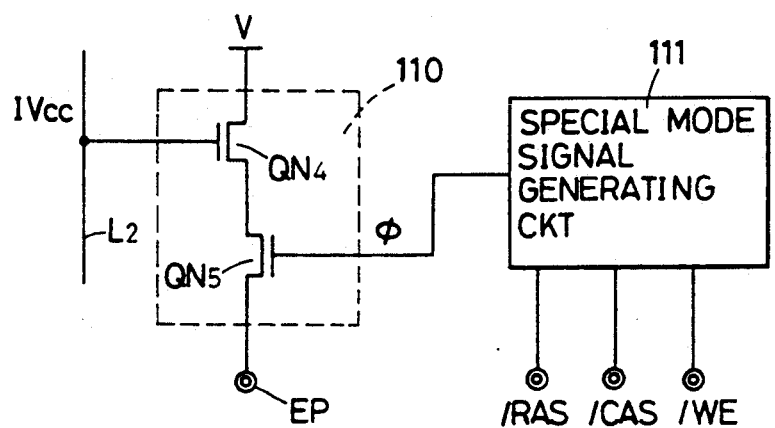
FIG. 30 is a circuit diagram showing a second example of the monitor circuit.

(b) A Second Monitor Method (FIG. 30)

Monitor circuit 110 includes N channel MOS transistors QN4 and QN5. Transistors QN4 and QN5 are connected in series between a constant voltage source V and an arbitrary external pin EP. Constant voltage source V is, for example, a power supply pin for receiving external supply voltage Vcc. Transistor QN4 has its gate connected to internal power supply line L2. Transistor QN5 has its gate supplied with a special mode signal $\phi$ from a special mode signal generating circuit 111.

Special mode signal generating circuit 111 generates special mode signal $\phi$ in response to a row address strobe signal /RAS, a column address strobe signal /CAS and a write enable signal /WE. Assume that a threshold voltage of transistors QN4 and QN5 is Vth.

First, respective potentials of constant voltage source V and external pin EP are set to 5V, and a potential of special mode signal $\phi$ is set to 7V. Then, the potential of external pin EP is gradually lowered while the current flowing between external pin EP and constant voltage source V is being monitored. A potential VINT of internal power supply line L2 is calculated in the following expression wherein the potential of external pin EP provided when the current starts flowing across external pin EP and constant voltage source V is VEXT.

$$VINT = VEXT + Vth$$

This makes it possible to monitor the potential of internal power supply line L2 without directly probing internal power supply line L2.

Figure 31:
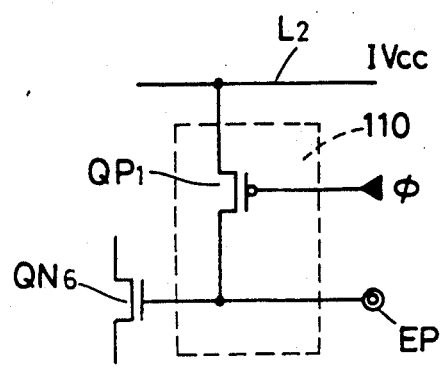
FIG. 31 is a circuit diagram showing a third example of the monitor circuit.

(c) A Third Monitor Method (FIG. 31)

A monitor circuit 110 includes a P channel MOS transistor QP1. Transistor QP1 is connected between internal power supply line L2 and an arbitrary external pin EP. Transistor QP1 has its gate supplied with a special mode signal $\phi$. An N channel MOS transistor QN6 is one of transistors in the internal circuit.

If a potential of special mode signal $\phi$ is set to 0V, then transistor QP1 is turned on, so that external pin EP and internal power supply line L2 are electrically connected with each other. Accordingly, a potential VINT of internal power supply line L2 can be calculated in the following expression by monitoring of a potential VEXT of external pin EP.

$$VINT = VEXT$$

This makes it possible to monitor the potential of internal power supply line L2 without directly probing internal power supply line L2.

Figure 32:
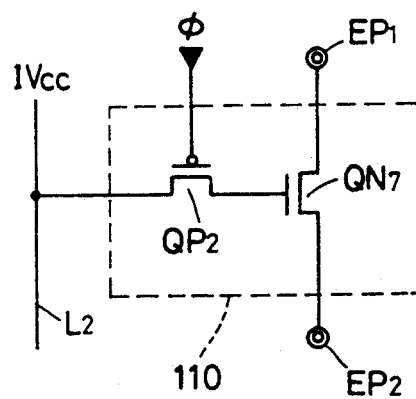
FIG. 32 is a circuit diagram showing a fourth example of the monitor circuit.

(d) A Fourth Monitor Method (FIG. 32)

A monitor circuit 110 includes an N channel MOS transistor QN7 and a P channel MOS transistor QP2. Transistor QN7 is connected between an arbitrary external pin EP1 and an arbitrary external pin EP2. Transistor QP2 is connected between internal power supply line L2 and a gate of transistor QN7. A special mode signal $\phi$ is applied to a gate of transistor QP2.

Assume that a threshold voltage of transistor QN7 is Vth. If a potential of special mode signal $\phi$ is set to 0V, then transistor QP2 is turned on, so that a potential of internal power supply line L2 is applied to the gate of transistor QN7. A potential of external pin EP1 is set to 5V. A potential of external pin EP2 is gradually lowered while the current flowing across external pins EP1 and EP2 is being monitored. Then, a potential VINT of internal power supply line L2 is calculated in the following expression wherein the potential of external pin EP2 provided when the current starts flowing across external pins EP1 and EP2 is VEXT.

$$VINT = VEXT + Vth$$

This makes it possible to monitor the potential of internal power supply line L2 without directly probing internal power supply line L2.

Figure 33:
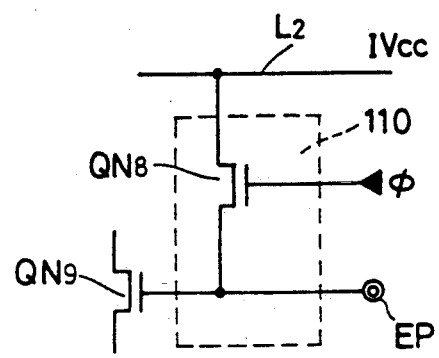
FIG. 33 is a circuit diagram showing a fifth example of the monitor circuit.

(e) A Fifth Monitor Method (FIG. 33)

A monitor circuit 110 includes an N channel MOS transistor QN8. Transistor QN8 is connected between internal power supply line L2 and an arbitrary external pin EP. Transistor QN8 has its gate supplied with a special mode signal $\phi$. An N channel MOS transistor QN9 is one of transistors in the internal circuit.

If a potential of special mode signal $\phi$ is set to 7V, then transistor QN8 is turned on, so that external pin EP and internal power supply line L2 are electrically connected with each other. A potential VINT of internal power supply line L2 is calculated in the following expression by measurement of a potential VEXT of external pin EP.

$$VINT = VEXT$$

This makes it possible to monitor the potential of internal power supply line L2 without directly probing power supply line L2.

Figure 34:
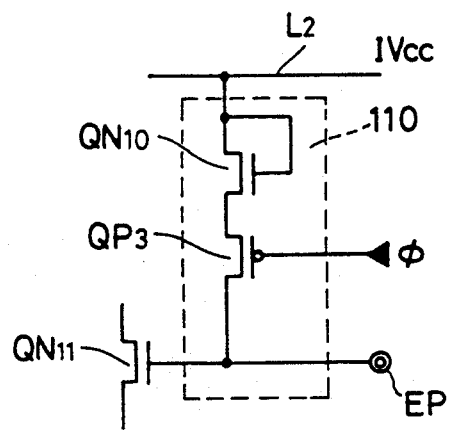
FIG. 34 is a circuit diagram showing a sixth example of the monitor circuit.

(f) A Sixth Monitor Method (FIG. 34)

A monitor circuit 110 includes an N channel MOS transistor QN10 and a P channel MOS transistor QP3. Transistor QN10 and transistor QP3 are connected in series between internal power supply line L2 and an arbitrary external pin EP. Transistor QN10 is diode-connected. A special mode signal $\phi$ is applied to a gate of transistor QP3. An N channel MOS transistor QN11 is one of transistors in the internal circuit. Assume that a threshold voltage of transistor QN10 is Vth First, if a potential of special mode signal $\phi$ is set to 0V, then transistor QP3 is turned on, so that internal power supply line L2 and external pin EP are connected with each other via transistor QN10. Therefore, a potential VINT of internal power supply line L2 is calculated in the following expression by measurement of a potential VEXT of external pin EP.

$$VINT = VEXT + Vth$$

This makes it possible to monitor the potential of internal power supply line L2 without directly probing power supply line L2.

The foregoing first to sixth monitor methods are applicable not only to the semiconductor device of FIG. 1 but also to various semiconductor devices having internal power supply lines.

The same configuration as that shown in FIG. 16 or 19 can be used as the configuration of special mode signal generating circuit 111.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   internal voltage down converting means for down-converting an external supply voltage to a predetermined internal supply voltage; and
   internal circuit means driven by said internal supply voltage, and
   said internal voltage down converting means including:
   first voltage supply means including a first conductive channel type field effect device and responsive to a first reference voltage for feedback controlling said first conductive channel type field effect device, thereby to supply said internal supply voltage to said internal circuit means,
   second voltage supply means including a second conductive channel type field effect device that responds to a second reference voltage to output said internal supply voltage and supply the output internal supply voltage to said internal circuit means, and
   control means for controlling activation and inactivation of said first voltage supply means.

2. The semiconductor device according to claim 1, wherein
   said first conductive channel type field effect device includes a P channel MOS transistor; and
   said second conductive channel type field effect device includes an N channel MOS transistor.

3. The semiconductor device according to claim 2, wherein
   said first voltage supply means further includes:
   first reference voltage generating means responsive to said external supply voltage for generating said first reference voltage, and
   differential amplifying means for differentially amplifying said first reference voltage and an output of said P channel MOS transistor,
   said P channel MOS transistor and said differential amplifying means constituting a feedback loop; and
   said second voltage supply means further includes:
   second reference voltage generating means responsive to said external supply voltage for generating said second reference voltage.

4. The semiconductor device according to claim 3, further comprising:
   an external power supply line for receiving said external supply voltage and an internal power supply line for receiving said internal supply voltage; wherein
   said P channel MOS transistor is connected between said external power supply line and said internal power supply line and has a gate for receiving an output of said differential amplifying means, and
   said N channel MOS transistor is connected between said external power supply line and said internal power supply line and has a gate for receiving said second reference voltage.

5. The semiconductor device according to claim 4, wherein
   said first voltage supply means further includes
   level shift means for level-shifting an output of said P channel MOS transistor to apply the level-shifted output to said differential amplifying means.

6. The semiconductor device according to claim 5, wherein
   said control means further includes
   means responsive to control of said first voltage supply means for activating or inactivating said level shift means.

7. The semiconductor device according to claim 5, wherein
said first voltage supply means further includes
amplifying means for amplifying an amplitude of an output of said level shift means.

8. The semiconductor device according to claim 1, wherein
said control means controls activation and inactivation of said first voltage supply means on the basis of current consumption of said internal circuit means.

9. The semiconductor device according to claim 1, wherein
said internal circuit means carries out an operation having an active period and a standby period; and
said control means activates said first voltage supply means in said active period and inactivates said first voltage supply means in said standby period.

10. The semiconductor device according to claim 1, wherein
said internal circuit means carries out an operation having an active period and a standby period; and
said control means activates said first voltage supply means in said active period, inactivates said first voltage supply means in said standby period and inactivates said first voltage supply means when the operation of said internal circuit means is in a steady state in said active period.

11. The semiconductor device according to claim 1, wherein
said internal circuit means includes dynamic storage means capable of performing a refresh operation; and
said control means inactivates said first voltage supply means when the operation of said storage means is in a steady state in said active period of said refresh operation.

12. A semiconductor device, comprising:
a plurality of internal voltage down converting means for down-converting an external supply voltage to a predetermined internal supply voltage;
a plurality of internal circuit means each corresponding to said plurality of internal voltage down converting means and each driven by corresponding internal supply voltages for carrying out an operation having an active period and a standby period; and
control means for controlling said plurality of internal voltage down converting means,
said internal voltage down converting means each including:
first voltage supply means including a first conductive channel type field effect device and responsive to a first reference voltage for feedback controlling said first conductive channel type field effect device, thereby to apply said internal supply voltages to the corresponding internal circuit means, and
second voltage supply means including a second conductive channel type field effect device that responds to a second reference voltage to output said internal supply voltages and applies the output internal supply voltages to the corresponding internal circuit means; wherein
said plurality of internal circuit means carry out different operations from each other, and
said control means activates first voltage supply means of each said internal voltage down converting means in said active period, inactivates first voltage supply means of each said internal voltage down converting means in said standby period, and inactivates corresponding first voltage supply means when the operation of each said internal circuit means is in a steady state in said active period.

13. The semiconductor device according to claim 12, wherein
said first conductive channel type field effect device includes a P channel MOS transistor, and
said second conductive channel type field effect device includes an N channel MOS transistor.

14. The semiconductor device according to claim 13, wherein
said first voltage supply means further includes:
first reference voltage generating means responsive to said external supply voltage for generating said first reference voltage, and
differential amplifying means for differentially amplifying said first reference voltage and an output of said P channel MOS transistor,
said P channel MOS transistor and said differential amplifying means constituting a feedback loop; and
said second voltage supply means further includes:
second reference voltage generating means responsive to said external supply voltage for generating said second reference voltage.

15. The semiconductor device according to claim 14, further comprising:
an external power supply line for receiving said external supply voltage and an internal power supply line for receiving said internal supply voltage; wherein
said P channel MOS transistor is connected between said external power supply line and said internal power supply line and has a gate for receiving an output of said differential amplifying means, and
said N channel MOS transistor is connected between said external power supply line and said internal power supply line and has a gate for receiving said second reference voltage.

16. A semiconductor device, comprising:
internal voltage down converting means for down-converting an external supply voltage to a predetermined internal supply voltage;
dynamic storage means driven by said internal supply voltage; and
control means for activating said internal voltage down converting means for only a minimum time period required for refresh of said storage means in a refresh operation period.

17. A semiconductor device comprising:
internal voltage down converting means for down-converting an external supply voltage to a predetermined internal supply voltage;
dynamic storage means driven by said internal supply voltage; and
control means for activating said internal voltage down converting means for only a minimum time period required for refresh of said storage means in a refresh operation period;
wherein said storage means includes
memory means including a plurality of memory cells and storing data therein,
selecting means for selecting a memory cell to be refreshed, and sense amplifier means for amplifying data read from the memory cell selected by said selecting means; and said internal voltage down converting means applies said internal supply voltage to said sense amplifier means, and said control means activates said internal voltage down converting means for only a minimum time period required for the refresh of the memory cell selected by said selecting means in said refresh operation period.

18. The semiconductor device according to claim 17, wherein said control means includes:

first signal generating means responsive to the initiation of the refresh of said selected memory cell for generating a first signal, second signal generating means responsive to the completion of the refresh of said selected memory cell for generating a second signal, and control signal generating means for generating a control signal that is activated in response to said first signal and inactivated in response to said second signal.

19. The semiconductor device according to claim 18, wherein said refresh operation includes an auto refresh operation.

20. The semiconductor device according to claim 18, wherein said refresh operation includes a CAS before RAS refresh operation.

21. The semiconductor device according to claim 19, wherein said first signal generating means includes timer means activated in said auto refresh operation period and generating said first signal for each definite period; and said second signal generating means includes means for delaying said first signal for a predetermined time period to generate said second signal.

22. The semiconductor device according to claim 20, wherein said selecting means includes an address buffer for generating an address signal for selecting a memory cell in said refresh operation;

said storage means further includes activating signal generating means responsive to said address signal for generating an activating signal for activating said sense amplifier means;

said first signal generating means includes signal generating means responsive to said address signal for generating said first signal; and said second signal generating means includes delay means for delaying said activating signal for a predetermined time period thereby to generate said second signal.

23. A semiconductor device, comprising:

a power supply terminal for receiving an external supply voltage;

internal voltage down converting means for down-converting said external supply voltage to a predetermined internal supply voltage;

internal circuit means driven by said internal supply voltage;

switch means provided between said power supply terminal and said internal circuit means; and control means for activating said internal voltage down converting means and turning said switch means off in a normal operation, and for inactivating said internal voltage down converting means and turning said switch means on in a test.

24. A semiconductor device comprising:

a power supply terminal for receiving an external supply voltage;

internal voltage down converting means for down-converting said external supply voltage to a predetermined internal supply voltage;

internal circuit means driven by said internal supply voltage;

switch means provided between said power supply terminal and said internal circuit means;

control means for activating said internal voltage down converting means and turning said switch means off in a normal operation, and for inactivating said internal voltage down converting means and turning said switch means on in a test; and means for externally receiving a control signal for controlling said internal circuit means;

wherein said control means carries out the control in said test when timing of said control signal is predetermined timing different from timing in the normal operation.

25. A semiconductor device comprising:

a power supply terminal for receiving an external supply voltage;

internal voltage down converting means for down-converting said external supply voltage to a predetermined internal supply voltage;

internal circuit means driven by said internal supply voltage;

switch means provided between said power supply terminal and said internal circuit means;

control means for activating said internal voltage down converting means and turning said switch means off in a normal operation, and for inactivating said internal voltage down converting means and turning said switch means on in a test; and means for externally receiving a control signal for controlling said internal circuit means, and an external terminal for receiving a predetermined signal or potential;

wherein said control means carries out said control in said test when timing of said control signal is predetermined timing different from the timing in the normal operation and a voltage level of said external terminal is a predetermined voltage level different from the level in the normal operation.

26. The semiconductor device according to claim 23, wherein said switch means includes a MOS transistor.

27. A semiconductor device, comprising:

internal voltage down converting means for down-converting an external supply voltage to a predetermined internal supply voltage; and internal circuit means driven by said internal supply voltage;

said internal voltage down converting means including:

reference voltage generating means responsive to said external supply voltage for generating a reference voltage, driver means for applying said internal supply voltage to said internal circuit means, level shift means for level-shifting an output of said driver means, amplifying means for amplifying an amplitude of an output of said level shift means, and differential amplifying means for differentially amplifying said reference voltage and an output of said amplifying means, said driver means being controlled by an output of said differential amplifying means.

28. The semiconductor device according to claim 27, wherein said amplifying means includes a current mirror circuit.

29. A semiconductor device, comprising:

an internal power supply line supplied with an internal supply voltage;

an external pad for receiving a predetermined signal or potential; and monitor means including a transistor connected between said external pad and said internal power supply line and having a known threshold value.

30. In a semiconductor device including an internal power supply line supplied with an internal supply voltage, an external pad for receiving a predetermined signal or potential, and a transistor connected between said external pad and said internal power supply line, a method of monitoring a potential of an internal power supply line, comprising the step of:

calculating the potential of said internal power supply line on the basis of a voltage of said external pad and a threshold voltage of said transistor.

31. The method according to claim 30, wherein said semiconductor device further includes a first terminal for receiving a supply potential and a second terminal for receiving a ground potential;

said monitor means includes a plurality of transistors connected between said external pad and said internal power supply line; and said calculating step includes the steps of:

monitoring a current flowing between said first terminal and said second terminal, applying a gradually increasing potential to said external pad, detecting an increase in the current flowing across said first terminal and said second terminal, and calculating the potential of said internal power supply line on the basis of a potential of said external pad upon said detection and a threshold voltage of said plurality of transistors.

32. The method according to claim 30, wherein said semiconductor device further includes a constant voltage source for supplying a constant voltage;

said monitor means includes first and second transistors connected in series between said external pad and said constant voltage source, and signal generating means for generating a special mode signal, said first transistor having a control terminal connected to said internal power supply line; and said calculating step includes the steps of:

turning said second transistor on in response to said special mode signal, monitoring a current flowing between said external pad and said constant voltage source, applying a gradually decreasing potential to said external pad, detecting that a current starts to flow across said external pad and said constant voltage source, and calculating a potential of said internal power supply line on the basis of a potential of said external pad upon said detection and a threshold voltage of said first transistor.

33. The method according to claim 30, wherein said monitor means includes a transistor connected between said external pad and said internal power supply line, and signal generating means for generating a special mode signal; and said calculating step includes the steps of:

turning said transistor on in response to said special mode signal, and monitoring the potential of said internal power supply line by monitoring the potential of said external pad.

34. The method according to claim 30, wherein said external pad includes first and second pads for receiving a predetermined signal or potential;

said monitor means includes a first transistor connected between said first and second pads and having a control terminal, a second transistor connected between said internal power supply line and the control terminal of said first transistor, and signal generating means for generating a special mode signal; and said calculating step includes the steps of:

turning said second transistor on in response to said special mode signal, monitoring a current flowing across said first and second pads, applying a predetermined potential to said first pad, applying a gradually decreasing voltage to said second pad, detecting that the current starts to flow across said first and second pads, and calculating a potential of said internal power supply line on the basis of a potential of said second pad upon said detection and a threshold voltage of said first transistor.

35. The semiconductor device according to claim 30, wherein said monitor means includes a first transistor diode-connected to said internal power supply line, a second transistor connected between said first transistor and said external pad, and signal generating means for generating a special mode signal; and said calculating step includes the steps of:

turning said second transistor on in response to said special mode signal, monitoring a potential of said external pad, and calculating said internal supply voltage on the basis of a threshold voltage of said first transistor and the potential of said external pad.

* * * * *

UNITED STATES PATENT AND TRADEMARK OFFICE
CERTIFICATE OF CORRECTION

PATENT NO.   : 5,249,155
DATED        : September 28, 1993
INVENTOR(S)  : Kazutami Arimoto et al.

It is certified that error appears in the above-identified patent and that said Letters Patent is hereby corrected as shown below:

Column 29,
Line 18, after "means", insert -- for monitoring a potential of said internal power supply line, --.

Signed and Sealed this

First Day of April, 2003

JAMES E. ROGAN
*Director of the United States Patent and Trademark Office*